United States Patent
Asadi et al.

(10) Patent No.: US 10,312,918 B2
(45) Date of Patent: Jun. 4, 2019

(54) PROGRAMMABLE LOGIC DESIGN

(71) Applicants: Hossein Asadi, Tehran (IR); Zahra Ebrahimi, Tehran (IR); Behnam Khaleghi, Tehran (IR)

(72) Inventors: Hossein Asadi, Tehran (IR); Zahra Ebrahimi, Tehran (IR); Behnam Khaleghi, Tehran (IR)

(73) Assignees: HIGH PERFORMANCE DATA STORAGE AND PROCESSING CORPORATION (IR); SHARIF UNIVERSITY OF TECHNOLOGY (IR)

( * ) Notice: Subject to any disclaimer, the term of this patent is extended or adjusted under 35 U.S.C. 154(b) by 0 days.

(21) Appl. No.: 15/895,321

(22) Filed: Feb. 13, 2018

(65) Prior Publication Data
US 2018/0175862 A1    Jun. 21, 2018

Related U.S. Application Data

(60) Provisional application No. 62/458,009, filed on Feb. 13, 2017.

(51) Int. Cl.
| | |
|---|---|
| *H03K 19/173* | (2006.01) |
| *H03K 19/177* | (2006.01) |
| *H03K 19/20* | (2006.01) |
| *H03K 19/00* | (2006.01) |
| *G06F 17/50* | (2006.01) |

(52) U.S. Cl.
CPC ... *H03K 19/17748* (2013.01); *H03K 19/0008* (2013.01); *H03K 19/17728* (2013.01); *H03K 19/17784* (2013.01); *H03K 19/20* (2013.01); *G06F 17/5036* (2013.01)

(58) Field of Classification Search
CPC ....... H03K 19/17748; H03K 19/17728; H03K 19/0008; H03K 19/20; H03K 19/17784; G06F 17/5036
USPC .......................................................... 326/38
See application file for complete search history.

(56) References Cited

U.S. PATENT DOCUMENTS

| | | | | |
|---|---|---|---|---|
| 5,245,226 | A | * | 9/1993 | Hood, Jr. ............ H03K 19/1737 326/47 |
| 5,477,165 | A | * | 12/1995 | ElAyat ............... G01R 31/2884 326/38 |
| 6,107,822 | A | * | 8/2000 | Mendel ............ H03K 19/17704 326/39 |
| 6,150,838 | A | * | 11/2000 | Wittig ................ H03K 19/1737 326/38 |

(Continued)

OTHER PUBLICATIONS

Hu et al. "Design and synthesis of programmable logic block with mixed LUT and macrogate." IEEE Transactions on Computer-Aided Design of Integrated Circuits and Systems 28, No. 4 (2009): 591-595.

(Continued)

*Primary Examiner* — Don P Le
(74) *Attorney, Agent, or Firm* — NovoTechIP International PLLC

(57) ABSTRACT

A programmable logic unit (PLU). The PLU includes a plurality of four-input reconfigurable hard logics (RHLs), a three-input look-up-table (LUT), and a plurality of reconfigurable inverters. The plurality of RHLs include a first RHL, a second RHL, and a third RHL. The plurality of reconfigurable inverters are associated with the plurality of RHLs.

18 Claims, 12 Drawing Sheets

(56) References Cited

U.S. PATENT DOCUMENTS

| | | | |
|---|---|---|---|
| 6,201,408 B1 | 3/2001 | Skahill et al. | |
| 6,236,229 B1 | 5/2001 | Or-Bach | |
| 6,353,331 B1 | 3/2002 | Shimanek | |
| 6,353,334 B1 * | 3/2002 | Schultz | H03K 19/01754 326/30 |
| 6,747,479 B1 | 6/2004 | Coppola et al. | |
| 6,798,239 B2 | 9/2004 | Douglass et al. | |
| 6,801,052 B2 | 10/2004 | Pugh et al. | |
| 7,288,960 B2 | 10/2007 | Kocan | |
| 7,663,400 B1 * | 2/2010 | Plants | G06F 7/506 326/38 |
| 8,314,636 B2 | 11/2012 | Hutton et al. | |
| 8,629,691 B2 | 1/2014 | Fitton et al. | |
| 2006/0164120 A1 * | 7/2006 | Verma | H03K 19/17736 326/41 |
| 2007/0063732 A1 * | 3/2007 | Kaptanoglu | H03K 19/1737 326/40 |
| 2007/0146178 A1 * | 6/2007 | Lewis | G11C 7/1045 341/106 |
| 2007/0164785 A1 * | 7/2007 | He | G06F 17/5054 326/41 |
| 2014/0145755 A1 * | 5/2014 | Itoh | H03K 19/1733 326/39 |
| 2017/0279451 A1 * | 9/2017 | Satou | G06F 9/5061 |

OTHER PUBLICATIONS

Chin et al. "Hybrid lut/multiplexer fpga logic architectures." IEEE Transactions on Very Large Scale Integration (VLSI) Systems 24, No. 4 (2016): 1280-1292.

Ahari et al. "Towards dark silicon era in fpgas using complementary hard logic design." In Field Programmable Logic and Applications (FPL), 2014 24th International Conference on, pp. 1-6. IEEE, 2014.

Ahmadpour et al. "An efficient reconfigurable architecture by characterizing most frequent logic functions." In Field Programmable Logic and Applications (FPL), 2015 25th International Conference on, pp. 1-6. IEEE, 2015.

Anderson et al. "Area-efficient FPGA logic elements: Architecture and synthesis." In Proceedings of the 16th Asia and South Pacific Design Automation Conference, pp. 369-375. IEEE Press, 2011.

Parandeh-Afshar et al. "Rethinking FPGAs: elude the flexibility excess of LUTs with and-inverter cones." In Proceedings of the ACM/SIGDA international symposium on Field Programmable Gate Arrays, pp. 119-128. ACM, 2012.

Kaviani et al. "Hybrid FPGA architecture." In Proceedings of the 1996 ACM Fourth International Symposium on Field-Programmable Gate Arrays, pp. 3-9. ACM, 1996.

Okamoto et al. "COGRE: A configuration memory reduced reconfigurable logic cell architecture for area minimization." In Field Programmable Logic and Applications (FPL), 2010 International Conference on, pp. 304-309. IEEE, 2010.

Luo et al. "A hybrid logic block architecture in FPGA for holistic efficiency." IEEE Transactions on Circuits and Systems II: Express Briefs 64, No. 1 (2017): 71-75.

Zilic et al. "Using decision diagrams to design ULMs for FPGAs." IEEE Transactions on Computers 47, No. 9 (1998): 971-982.

Bsoul et al. "An FPGA architecture supporting dynamically controlled power gating." In Field-Programmable Technology (FPT), 2010 International Conference on, pp. 1-8. IEEE, 2010.

Ishihara et al. "A low-power FPGA based on autonomous fine-grain power gating." IEEE Transactions on Very Large Scale Integration (VLSI) Systems 19, No. 8 (2011): 1394-1406.

James et al. "A Fine-Grain Power-Gated FPGA with an Area Efficient High Speed Time Multiplexed Level Encoded Dual Rail Architecture." International Journal of Scientific & Engineering Research 4, No. 8 (2013).

Sathyendran. "Hybrid Reconfigurable FPGA Architecture Based on Autonomous Fine-Grain Power-Gating." International Journal of Computer Science & Engineering Technology (IJCSET) 6, No. 2 (2015): 42-47.

Meyer et al. "Sharing of SRAM tables among NPN-equivalent LUTs in SRAM-based FPGAs." IEEE transactions on very large scale integration (VLSI) systems 15, No. 2 (2007): 182-195.

* cited by examiner

PROGRAMMABLE LOGIC DESIGN

CROSS-REFERENCE TO RELATED APPLICATION

This application claims the benefit of priority from U.S. Provisional Patent Application Ser. No. 62/458,009, filed on Feb. 13, 2017, and entitled "LOW-POWER FIELD PROGRAMMABLE GATE ARRAYS USING PROGRAMMABLE HARD LOGICS," which is incorporated herein by reference in its entirety.

SPONSORSHIP STATEMENT

This application has been sponsored by Iran Patent Center, which does not have any rights in this application.

TECHNICAL FIELD

The present disclosure generally relates to integrated circuits, and particularly to programmable logic units.

BACKGROUND

A Field-Programmable Gate Array (FPGA) is an integrated circuit (a programmable device) consisting of logic and routing resources, with the capacity to implement various customer-designed hardware circuits. These programmable devices have been used since the 1980s in a wide range of applications from embedded systems to parallel high-performance computing. The tremendous growth in transistor density and the increasing power density in nano-CMOS has led to an end of Dennard scaling. There is now further integration of CMOS technology in FPGAs, resulting in aggressive growth of the inactive percentages of silicon die, also referred to as Dark Silicon.

However, the smaller footprint of logic resources relative to their high power consumption results in a power density greater than routing resources can accommodate, and may lead to 'hot spots' or other thermal challenges such as leakage-temperature positive feedback, performance degradation, and intensified aging.

The major contributors to FPGA high power are logic resources, in particular K-input look-up tables (LUTs) which serve as the primary blocks responsible for implementing an applications' functionality. K-input LUTs (K-LUTs) are logic elements that can implement all possible K-input functions. Hence, such applications can be mapped using adequate resources.

Although the overall performance of FPGA devices consisting of large-input LUTs is improved, increasing the number of LUT inputs comes at the expense of a higher area footprint and greater power consumption as a result of their larger, inefficient structure. Furthermore, the propagation delay of the LUT increases linearly, negatively affecting the profits obtained using large-input LUTs. Hence, LUTs equipped with more than six inputs are rarely used. Among the various configurations of LUTs, 4-LUTs afford designs associated with the smallest area. However, non-uniform distribution of the different functions used in the applications has led to poor logic utilization of 4-LUTs.

Various alternative architectures have been proposed, based on either power-gating of unused resources or manufacturing processes of low-leakage transistors. Such substitute architectures can reduce static power, but suffer from performance overhead. As an example, low-leakage manufacturing processes have been exploited. These manufacturing processes include variable transistor gate length, triple gate oxide, and multiple-Vth employed in interconnect pass transistors and configuration memory cells. However, such techniques cannot be employed in entire chip resources, due to the performance loss associated with the high-threshold transistors. In addition, these techniques may not be cost-effective due to the complexity of manufacture and fabrication.

Other types of structures have employed static (offline) or dynamic (online) power gating of unused logic and routing resources. However, such structures suffer from a large 'wake-up' (power-on) current. This current is drawn from the power rails, and can lead to register content instability, functional error, greater power overhead, and longer wake-up time. In addition, the idleness period must be large enough to offset the mentioned overheads. Moreover, the application behavior of these structures is unpredictable in interactive or input-dependent usages.

There is, therefore, a need for a logic unit with a simplified structure configured to provide high performance and reliability with a reduced number of cells, and associated with reduced static and dynamic power dissipation. There is also a need for a power allocation mechanism for power gating unused cells and modules in the logic unit. There is further a need for a method of efficiently mapping logic functions to the simplified logic unit structure, such that FPGAs or other programmable logic devices (PLDs) can be built up or into greater complexity using the simplified structure.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes a programmable logic unit (PLU). The PLU may include a plurality of four-input reconfigurable hard logics (RHLs), a three-input look-up-table (LUT), and a plurality of reconfigurable inverters. The plurality of RHLs may include a first RHL, a second RHL, and a third RHL. The plurality of reconfigurable inverters may be associated with the plurality of RHLs.

The above general aspect may include one or more of the following features. In some implementations, the PLU may further comprise a plurality of inputs, a plurality of outputs, a plurality of power gating cells, a plurality of configuration cells, and a reconfigurable power controller (RPC). The plurality of inputs may include a first input, a second input, a third input, and a fourth input. The plurality of outputs may include a first output, a second output, a third output, and a fourth output. The plurality of power gating cells may include a first power gating cell, a second power gating cell, a third power gating cell, and a fourth power gating cell. The plurality of configuration cells may include a first configuration cell, a second configuration cell, a third configuration cell, a fourth configuration cell, a fifth configuration cell, a sixth configuration cell, a seventh configuration cell, and an eighth configuration cell.

In some implementations, the first RHL may include a first reconfigurable inverter of the plurality of reconfigurable inverters, a second reconfigurable inverter of the plurality of reconfigurable inverters, a first two-input NAND gate, a first two-input NOR gate, a third reconfigurable inverter of the plurality of reconfigurable inverters, a fourth reconfigurable inverter of the plurality of reconfigurable inverters, a second two-input NAND gate, and a fifth reconfigurable inverter of the plurality of reconfigurable inverters. The first reconfigurable inverter may be associated with the first configuration cell, and may receive the first input. The second reconfigurable inverter may be associated with the second configuration cell, and may receive the fourth input. The first two-input NAND gate may receive the second input and be coupled with the first reconfigurable inverter to receive the output of the first reconfigurable inverter. The first two-input NOR gate may receive the third input and be coupled with the second reconfigurable inverter to receive the output of the second reconfigurable inverter. The third reconfigurable inverter may be associated with the third configuration cell, and be coupled with the first two-input NAND gate to receive the output of the first two-input NAND gate. The fourth reconfigurable inverter may be associated with the fourth configuration cell, and be coupled with the first two-input NOR gate to receive the output of the first two-input NOR gate. The second two-input NAND gate be coupled with the third reconfigurable inverter and the fourth reconfigurable inverter to receive the outputs of the third reconfigurable inverter and the fourth reconfigurable inverter. The fifth reconfigurable inverter may be associated with the fifth configuration cell, and be coupled with the second two-input NAND gate to receive the output of the second two-input NAND gate. The output of the fifth reconfigurable inverter may be connected to the first output.

In one implementation, the second RHL may include a sixth reconfigurable inverter of the plurality of reconfigurable inverters, a seventh reconfigurable inverter of the plurality of reconfigurable inverters, an eighth reconfigurable inverter of the plurality of reconfigurable inverters, a ninth reconfigurable inverter of the plurality of reconfigurable inverters, a third two-input NAND gate, a fourth two-input NAND gate, a tenth reconfigurable inverter of the plurality of reconfigurable inverters, an eleventh reconfigurable inverter of the plurality of reconfigurable inverters, a fifth two-input NAND gate, a twelfth reconfigurable inverter of the plurality of reconfigurable inverters, a sixth two-input NAND gate, and a thirteenth reconfigurable inverter of the plurality of reconfigurable inverters. The sixth reconfigurable inverter may be associated with the first configuration cell, and may receive the first input. The seventh reconfigurable inverter may be associated with the second configuration cell, and may receive the second input. The eighth reconfigurable inverter may be associated with the third configuration cell, and may receive the third input. The ninth reconfigurable inverter may be associated with the fourth configuration cell, and may receive the fourth input. The third two-input NAND gate may receive the third input, and be coupled with the seventh reconfigurable inverter to receive the output of the seventh reconfigurable inverter. The fourth two-input NAND gate be coupled with the eighth reconfigurable inverter and the ninth reconfigurable inverter to receive the outputs of the eighth reconfigurable inverter and the ninth reconfigurable inverter. The tenth reconfigurable inverter may be associated with the fifth configuration cell, and be coupled with the third two-input NAND gate to receive the output of the third two-input NAND gate. The eleventh reconfigurable inverter may be associated with the sixth configuration cell, and be coupled with the fourth two-input NAND gate to receive the output of the fourth two-input NAND gate. The fifth two-input NAND gate be coupled with the tenth reconfigurable inverter and the eleventh reconfigurable inverter to receive the outputs of the tenth reconfigurable inverter and the eleventh reconfigurable inverter. The twelfth reconfigurable inverter may be associated with the seventh configuration cell, and be coupled with the fifth two-input NAND gate to receive the output of the fifth two-input NAND gate. The sixth two-input NAND gate may be coupled with the sixth reconfigurable inverter and the twelfth reconfigurable inverter to receive the outputs of the sixth reconfigurable inverter and the twelfth reconfigurable inverter. The thirteenth reconfigurable inverter may be associated with the eighth configuration cell, and be coupled with the sixth two-input NAND gate to receive the output of the sixth two-input NAND gate. The output of the thirteenth reconfigurable inverter may be connected to the second output.

In different implementations, the third RHL may include a fourteenth reconfigurable inverter of the plurality of reconfigurable inverters, a fifteenth reconfigurable inverter of the plurality of reconfigurable inverters, a sixteenth reconfigurable inverter of the plurality of reconfigurable inverters, a seventeenth reconfigurable inverter of the plurality of reconfigurable inverters, an eighteenth reconfigurable inverter of the plurality of reconfigurable inverters, a second two-input NOR gate, a third two-input NOR gate, a nineteenth reconfigurable inverter of the plurality of reconfigurable inverters, a twentieth reconfigurable inverter of the plurality of reconfigurable inverters, a first three-input NAND gate, a second three-input NAND gate, a fourth two-input NOR gate, and a twenty first reconfigurable inverter of the plurality of reconfigurable inverters. The fourteenth reconfigurable inverter may be associated with the first configuration cell, and may receive the first input. The fifteenth reconfigurable inverter may be associated with the second configuration cell, and may receive the fourth input. The sixteenth reconfigurable inverter may be associated with the third configuration cell, and may receive the second input. The seventeenth reconfigurable inverter may be associated with the fourth configuration cell, and may receive the third input. The eighteenth reconfigurable inverter may be associated with the fifth configuration cell, and may receive the fourth input. The second two-input NOR gate may receive the third input, and be coupled with the sixteenth reconfigurable inverter to receive the output of the sixteenth reconfigurable inverter. The third two-input NOR gate may receive the second input, and be coupled with the seventeenth reconfigurable inverter to receive the output of the seventeenth reconfigurable inverter. The nineteenth reconfigurable inverter may be associated with the sixth configuration cell, and be coupled with the second two-input NOR gate to receive the output of the second two-input NOR gate. The twentieth reconfigurable inverter may be associated with the seventh configuration cell, and be coupled with the third two-input NOR gate to receive the output of the third two-input NOR gate. The first three-input NAND gate be coupled with the fourteenth reconfigurable inverter, the fifteenth reconfigurable inverter, and the nineteenth reconfigurable inverter, to receive the outputs of the fourteenth reconfigurable inverter, the fifteenth reconfigurable inverter, and the nineteenth reconfigurable inverter. The second three-input NAND gate may receive the first input, and be coupled with the eighteenth reconfigurable inverter and the twentieth reconfigurable inverter to receive the outputs of the eighteenth reconfigurable inverter and the twentieth reconfigurable inverter. The fourth two-input NOR gate may be coupled with the first three-input NAND gate and the second three-input NAND gate to receive the outputs of the first three-input NAND gate and the second three-input NAND gate. The twenty first reconfigurable inverter may be associated with the eighth configuration cell, and be coupled with the fourth two-input NOR gate to receive the output of the fourth two-input NOR gate. The output of the twenty first reconfigurable inverter may be connected to the third output.

In one example, the LUT may be associated with the plurality of configuration cells. The output of the LUT may be connected to the fourth output. In other implementations, a first transistor may be configured to couple the first RHL with a power supply, in response to the first power gating cell being active. A second transistor may be configured to couple the second RHL with the power supply, in response to the second power gating cell being active. A third transistor may be configured to couple the third RHL with the power supply, in response to the third power gating cell being active. A fourth transistor may be configured to couple the LUT with the power supply, in response to the fourth power gating cell being active.

In some implementations, the reconfigurable power controller may be configured to activate the first configuration cell, the second configuration cell, the third configuration cell, the fourth configuration cell, and the fifth configuration cell, in response to the first power gating cell being active. The reconfigurable power controller may be configured to activate the plurality of configuration cells in response to any of the second power gating cell, the third power gating cell, and the fourth power gating cell being active. In other implementations, the reconfigurable power controller may include a three-input AND gate, a two-input AND gate, a first inverter, and a second inverter. The three-input AND gate may be coupled with the second power gating cell, the third power gating cell, and the fourth power gating cell, for receiving the values of the second power gating cell, the third power gating cell, and the fourth power gating cell. The two-input AND gate may be coupled with the three-input AND gate and the first power gating cell, to receive the output of the two-input AND gate and the value of the first power gating cell. The first inverter may be coupled with the two-input AND gate to receive the output of the two-input AND gate. The output of the first inverter may be loaded into each of the first configuration cell, the second configuration cell, the third configuration cell, the fourth configuration cell, and the fifth configuration cell. The second inverter may be coupled with the three-input AND gate to receive the output of the three-input AND gate. The output of the second inverter may be loaded into each of the sixth configuration cell, the seventh configuration cell, and the eighth configuration cell.

In some cases, each of the plurality of power gating cells may include a static random-access memory (SRAM) cell. In other cases, the plurality of configuration cells may include a SRAM cell.

In one implementation, each reconfigurable inverter of the plurality of reconfigurable inverters may be associated with a configuration cell. The reconfigurable inverter may be configured to act as an inverter in response to the configuration cell being set. The reconfigurable inverter may be configured to act as a buffer in response to the configuration cell being reset.

In another general aspect, the present disclosure describes a method for mapping a Boolean function of a plurality of inputs to a circuit. The circuit may include a plurality of programmable logic units (PLUs). Each of the PLUs may include a first reconfigurable hard logic (RHL), a second RHL, a third RHL, and a look-up table (LUT). The method may comprise generating a first list of negating-permuting- negating functions (NPNs), generating a second list of NPNs, generating a third list of NPNs, matching the Boolean function to a first NPN, mapping the Boolean function to the first RHL in response to the first NPN being included in the first list, mapping the Boolean function to the second RHL in response to the first NPN not being included in the first list and being included in the second list, mapping the Boolean function to the third RHL in response to the first NPN not being included in any of the first list and the second list and being included in the third list, and mapping the Boolean function to the LUT in response to the first NPN not being included in any of the first list, the second list, and the third list, and the number of the plurality of inputs being smaller than four. The first list of NPNs may correspond to the first RHL. The second list of NPNs may correspond to the second RHL. The third list of NPNs may correspond to the third RHL.

The above general aspect may include one or more of the following features. In some implementations, the method may further comprise mapping the Boolean function to a first PLU and a second PLU of the plurality of PLUs in response to the Boolean function meeting a decomposition condition, and mapping the Boolean function to a third PLU, a fourth PLU, and a fifth PLU of the plurality of PLUs in response to the Boolean function not meeting the decomposition condition. The second PLU may be coupled with the first PLU to receive the output of the first PLU. The fifth PLU may be coupled with the third PLU and the fourth PLU to receive the outputs of the third PLU and the fourth PLU.

In some examples, mapping the Boolean function to the first PLU and the second PLU may include decomposing the Boolean function into a series of two sub-functions, including a first sub-function and a second sub-function, matching the first sub-function to a second NPN, matching the second sub-function to a third NPN, and mapping the Boolean function to the first PLU and the second PLU in response to the Boolean function meeting the decomposition condition. The first sub-function may include a plurality of first sub-function inputs and a first sub-function output. The second sub-function may receive the first sub-function output. The decomposition condition may include a first sub-condition and one of a second sub-condition and a third sub-condition. The first sub-condition may include the third NPN being included in one of the first list, the second list, and the third list. The second sub-condition may include the second NPN being included in one of the first list, the second list, and the third list. The third sub-condition may include the number of the plurality of first sub-function inputs being smaller than four.

In one implementation, mapping the Boolean function to the first PLU may include mapping the first sub-function to the first RHL in response to the second NPN being included in the first list, mapping the first sub-function to the second RHL in response to the second NPN not being included in the first list and being included in the second list, mapping the first sub-function to the third RHL in response to the second NPN not being included in any of the first list and the second list and being included in the third list, and mapping the first sub-function to the LUT in response to the second NPN not being included in any of the first list, the second list, and the third list, and the number of the plurality of first sub-function inputs being smaller than four. In another implementation, mapping the Boolean function to the second PLU may include mapping the second sub-function to the first RHL in response to the third NPN being included in the first list, mapping the second sub-function to the second RHL in response to the third NPN not being included in the first list and being included in the second list, and mapping the second sub-function to the third RHL in response to the third NPN not being included in any of the first list and the second list and being included in the third list.

In different implementations, mapping the Boolean function to the third PLU, the fourth PLU, and the fifth PLU may include decomposing the Boolean function into a pair of cofactors including a first cofactor and a second cofactor, mapping the first cofactor to the third PLU, mapping the second cofactor to the fourth PLU, and configuring the fifth PLU to act as a two-to-one multiplexer. The two-to-one multiplexer may receive one of the plurality of inputs as a selector input of the two-to-one multiplexer. Mapping the first cofactor to the third PLU may include matching the first cofactor to a fourth NPN, mapping the first cofactor to the first RHL in response to the fourth NPN being included in the first list, mapping the first cofactor to the second RHL in response to the fourth NPN not being included in the first list and being included in the second list, mapping the first cofactor to the third RHL in response to the fourth NPN not being included in any of the first list and the second list, and being included in the third list, and mapping the first cofactor to the LUT in response to the fourth NPN not being included in any of the first list, the second list, and the third list. Mapping the second cofactor to the fourth PLU may include matching the second cofactor to a fifth NPN, mapping the second cofactor to the first RHL in response to the fifth NPN being included in the first list, mapping the second cofactor to the second RHL in response to the fifth NPN not being included in the first list and being included in the second list, mapping the second cofactor to the third RHL in response to the fifth NPN not being included in any of the first list and the second list, and being included in the third list, and mapping the second cofactor to the LUT in response to the fifth NPN not being included in any of the first list, the second list, and the third list. In some examples, configuring the fifth PLU may include configuring the first RHL to act as the two-to-one multiplexer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

The following detailed description is presented to enable a person skilled in the art to make and use the methods and devices disclosed in exemplary implementations of the present disclosure. For purposes of explanation, specific nomenclature is set forth to provide a thorough understanding of the present disclosure. However, it will be apparent to one skilled in the art that these specific details are not required to practice the disclosed exemplary implementations. Descriptions of specific exemplary implementations are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

The present disclosure describes implementations of a programmable logic unit (PLU). For purposes of this application, a PLU is a logic block that can include reconfigurable hard logics (RHLs), and a number of configuration cells that are shared among the RHLs by a reconfigurable power controller (RPC). In different implementations, the RHLs are programmable modules that may be arranged in a tree structure and include a plurality of logic gates. The logic gates, as well as the inputs and outputs of the RHLs, may be associated with reconfigurable inverters. The entire PLU, or one or more RHLs, may be used as an exclusive and/or alternative logic component of integrated circuits (ICs), including field programmable gate arrays (FPGAs) and programmable logic devices (PLDs). The PLUs can reduce the number of configuration cells as well as the propagation delay of a circuit mapped into typical look-up table (LUT)-based FPGAs, thereby obtaining improved performance, reliability, and lower static and dynamic power dissipations. Each RHL can be designed to implement a significant portion of frequent logic functions that have the same negating-permuting-negating (NPN)-class representation in industrial and standard applications. Therefore, by utilizing a plurality of RHLs in the PLU, a majority of Boolean functions can be implemented via a method of mapping each function to a RHL that has higher power efficiency. This PLU can provide a more optimal tradeoff between static and dynamic power dissipation, performance, reliability, and hardware cost. In addition, a wide range of LUTs can be utilized along with different implementations of the PLU in a FPGA.

Figure 1:
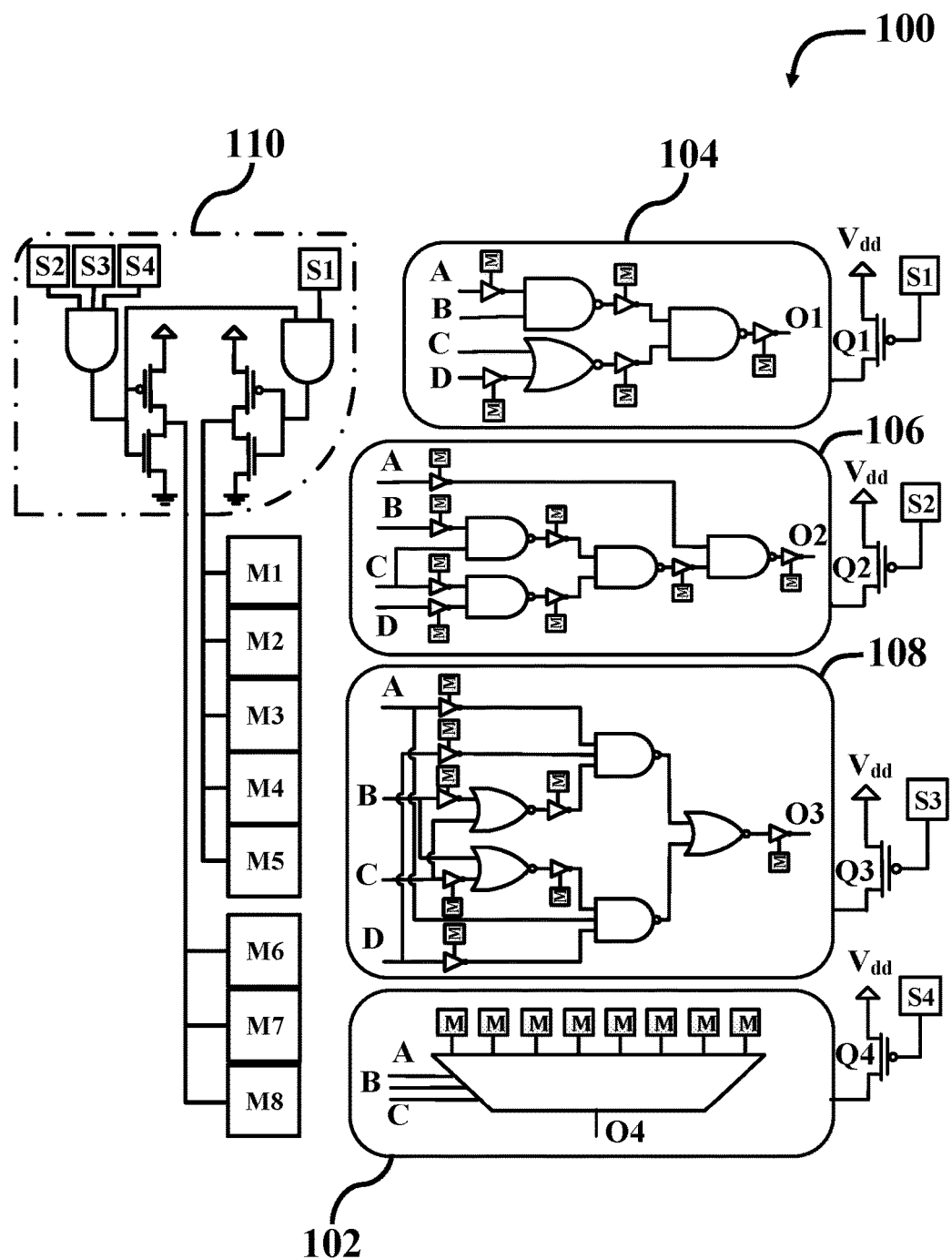
FIG. 1 illustrates an implementation of a programmable logic unit (PLU).

FIG. 1 depicts an implementation of a PLU 100, according to one or more implementations of the present disclosure. The PLU 100 is configured for implementation of Boolean functions by use of logic modules. In some implementations, the PLU 100 may include a plurality of four-input reconfigurable hard logics (RHLs), a three-input look-up table (LUT) 102, and a plurality of reconfigurable inverters. The plurality of reconfigurable inverters may be associated with the plurality of RHLs. The plurality of RHLs may include a first RHL 104, a second RHL 106, and a third RHL 108. The LUT 102 and each of the plurality of RHLs may be configured to implement a portion of the Boolean functions. In some examples, each reconfigurable inverter of the plurality of reconfigurable inverters may be associated with a configuration cell. In one implementation the reconfigurable inverter functions as an inverter in response to the configuration cell being set, and functions as a buffer in response to the configuration cell being reset. In these cases, the reconfigurable inverter can be implemented by an XOR gate associated with the configuration cell. In another example, the PLU 100 may be implemented as part of an integrated circuit, including a field-programmable gate array (FPGA) with a look-up table structure, or a programmable logic device (PLD).

In some implementations, the PLU 100 may further include a plurality of inputs, a plurality of outputs O1-O4, a plurality of configurable cells S1-S4 (hereinafter referred to as power gating cells), a plurality of configuration cells M1-M8, and a reconfigurable power controller (RPC) 110 for power gating each of the plurality of configuration cells M1-M8. In this example, the plurality of inputs includes a first input A, a second input B, a third input C, and a fourth input D, and the plurality of outputs includes a first output O1, a second output O2, a third output O3, and a fourth output O4. Furthermore, the plurality of power gating cells include a first power gating cell S1, a second power gating cell S2, a third power gating cell S3, and a fourth power gating cell S4. The plurality of configuration cells include a first configuration cell M1, a second configuration cell M2, a third configuration cell M3, a fourth configuration cell M4, a fifth configuration cell M5, a sixth configuration cell M6, a seventh configuration cell M7, and an eighth configuration cell M8.

Figure 2:
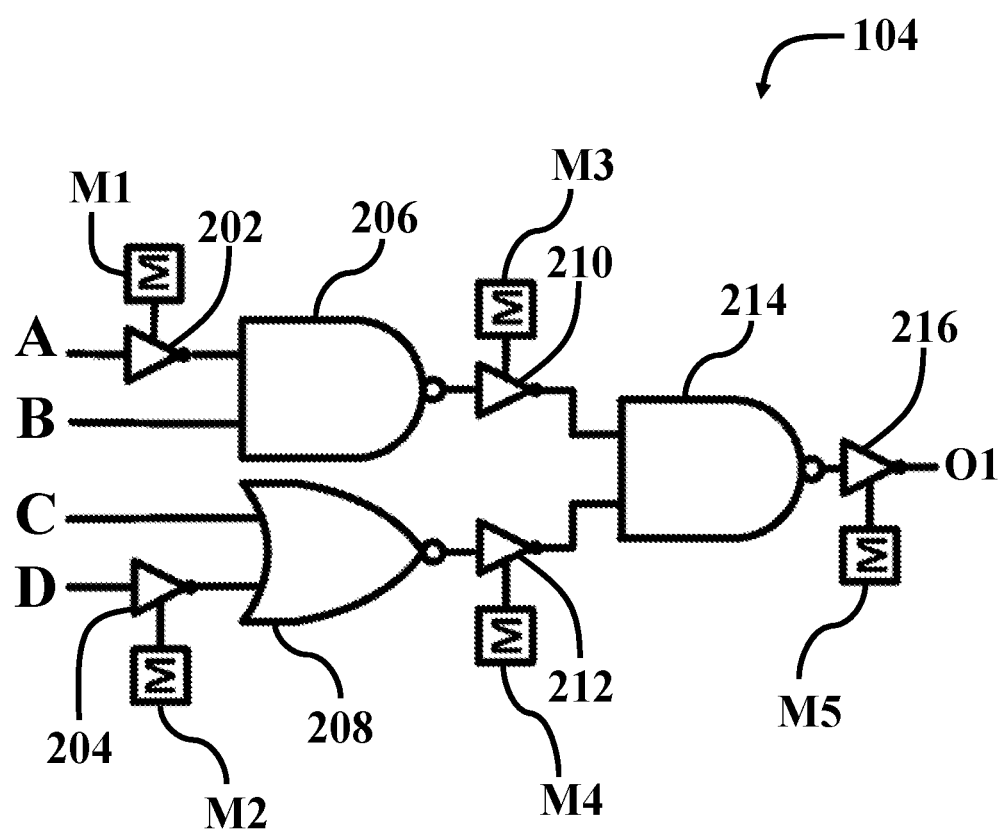
FIG. 2 illustrates an implementation of a first reconfigurable hard logic (RHL).
Figure 3:
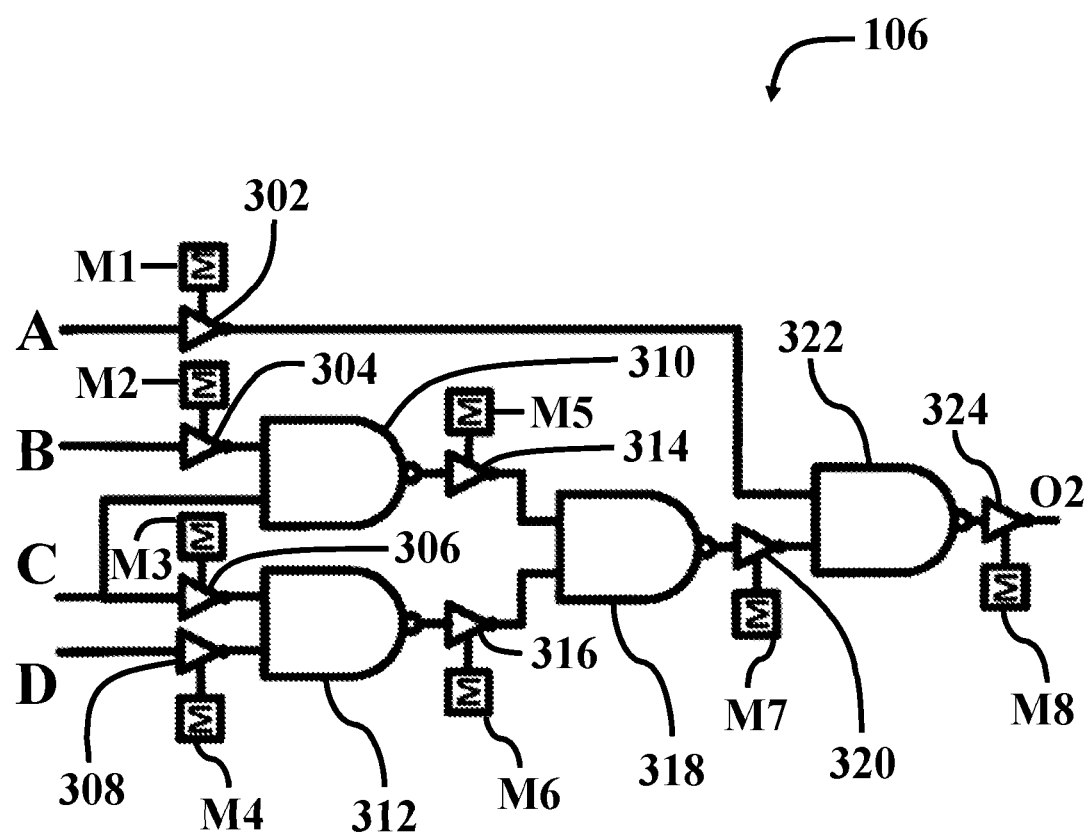
FIG. 3 illustrates an implementation of a second RHL.
Figure 4:
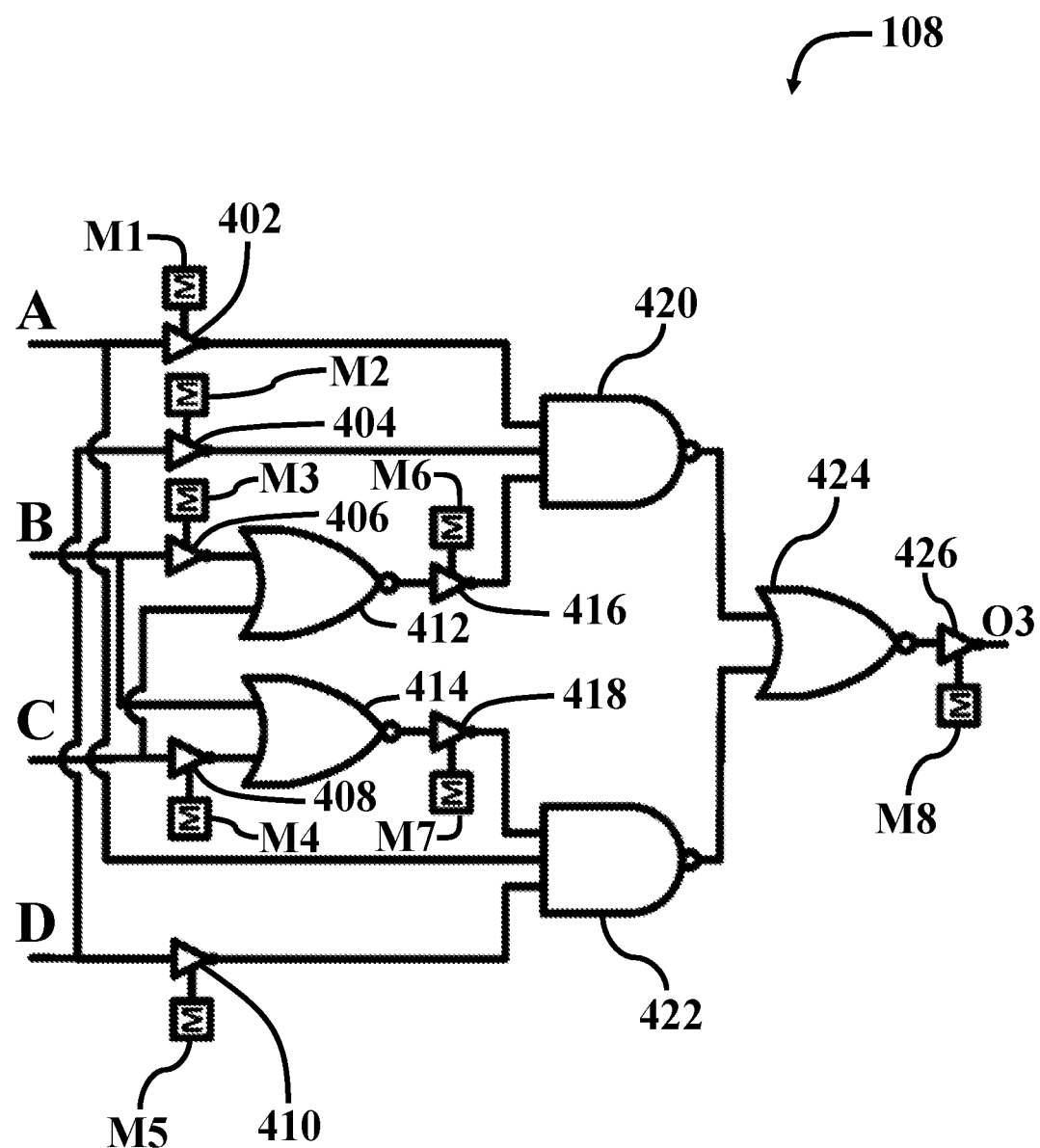
FIG. 4 illustrates an implementation of a third RHL.

Referring now to FIGS. 2-4, further details regarding the RHLs are presented. FIG. 2 depicts an implementation of the first RHL 104. In some implementations, the first RHL 104 includes a first reconfigurable inverter 202 of the plurality of reconfigurable inverters, a second reconfigurable inverter 204 of the plurality of reconfigurable inverters, a first two-input NAND gate 206, a first two-input NOR gate 208, a third reconfigurable inverter 210 of the plurality of reconfigurable inverters, a fourth reconfigurable inverter 212 of the plurality of reconfigurable inverters, a second two-input NAND gate 214, and a fifth reconfigurable inverter 216 of the plurality of reconfigurable inverters. The first reconfigurable inverter 202 may be associated with the first configuration cell M1, and may receive the first input A. The second reconfigurable inverter 204 may be associated with the second configuration cell M2, and may receive the fourth input D. The first two-input NAND gate 206 may receive the second input B, and be coupled with the first reconfigurable inverter 202 to receive the output of the first reconfigurable inverter 202. The first two-input NOR gate 208 may receive the third input C, and be coupled with the second reconfigurable inverter 204 to receive the output of the second reconfigurable inverter 204. The third reconfigurable inverter 210 may be associated with the third configuration cell M3 and be coupled with the first two-input NAND gate 206 to receive the output of the first two-input NAND gate 206. The fourth reconfigurable inverter 212 may be associated with the fourth configuration cell M4, and be coupled with the first two-input NOR gate 208 to receive the output of the first two-input NOR gate 208. The second two-input NAND gate 214 is coupled with the third reconfigurable inverter 210 and the fourth reconfigurable inverter 212 to receive the outputs of the third reconfigurable inverter 210 and the fourth reconfigurable inverter 212. The fifth reconfigurable inverter 216 may be associated with the fifth configuration cell M5, and be coupled with the second two-input NAND gate 214 to receive the output of the second two-input NAND gate 214. The output of the fifth reconfigurable inverter 216 may be connected to the first output O1. Thus, the first RHL 104 can be viewed as a two-level logic, where a first level includes the first two-input NAND gate 206 and the first two-input NOR gate 208, followed by a second level including the second two-input NAND gate 214.

FIG. 3 depicts an implementation of the second RHL 106. In some implementations, the second RHL 106 includes a sixth reconfigurable inverter 302 of the plurality of reconfigurable inverters, a seventh reconfigurable inverter 304 of the plurality of reconfigurable inverters, an eighth reconfigurable inverter 306 of the plurality of reconfigurable inverters, a ninth reconfigurable inverter 308 of the plurality of reconfigurable inverters, a third two-input NAND gate 310, a fourth two-input NAND gate 312, a tenth reconfigurable inverter 314 of the plurality of reconfigurable inverters, an eleventh reconfigurable inverter 316 of the plurality of reconfigurable inverters, a fifth two-input NAND gate 318, a twelfth reconfigurable inverter 320 of the plurality of reconfigurable inverters, a sixth two-input NAND gate 322, and a thirteenth reconfigurable inverter 324 of the plurality of reconfigurable inverters. The sixth reconfigurable inverter 302 may be associated with the first configuration cell M1, and receive the first input A. The seventh reconfigurable inverter 304 may be associated with the second configuration cell M2, and receive the second input B. The eighth reconfigurable inverter 306 may be associated with the third configuration cell M3, and receive the third input C. The ninth reconfigurable inverter 308 may be associated with the fourth configuration cell M4, and receive the fourth input D. The third two-input NAND gate 310 may receive the third input C, and be coupled with the seventh reconfigurable inverter 304 to receive the output of the seventh reconfigurable inverter 304. The fourth two-input NAND gate 312 may be coupled with the eighth reconfigurable inverter 306 and the ninth reconfigurable inverter 308 to receive the outputs of the eighth reconfigurable inverter 306 and the ninth reconfigurable inverter 308. The tenth reconfigurable inverter 314 may be associated with the fifth configuration cell M5, and be coupled with the third two-input NAND gate 310 to receive the output of the third two-input NAND gate 310. The eleventh reconfigurable inverter 316 may be associated with the sixth configuration cell M6, and be coupled with the fourth two-input NAND gate 312 to receive the output of the fourth two-input NAND gate 312. The fifth two-input NAND gate 318 may be coupled with the tenth reconfigurable inverter 314 and the eleventh reconfigurable inverter 316 to receive the outputs of the tenth reconfigurable inverter 314 and the eleventh reconfigurable inverter 316. The twelfth reconfigurable inverter 320 may be associated with the seventh configuration cell M7, and be coupled with the fifth two-input NAND gate 318 to receive the output of the fifth two-input NAND gate 318. The sixth two-input NAND gate 322 may be coupled with the sixth reconfigurable inverter 302 and the twelfth reconfigurable inverter 320, to receive the outputs of the sixth reconfigurable inverter 302 and the twelfth reconfigurable inverter 320. The thirteenth reconfigurable inverter 324 may be associated with the eighth configuration cell M8, and be coupled with the sixth two-input NAND gate 322 to receive the output of the sixth two-input NAND gate 322. The output of the thirteenth reconfigurable inverter 324 may be connected to the second output second output O2. Thus, in some implementations, the second RHL 106 can be viewed as a three-level logic, where a first level includes the third two-input NAND gate 310 and the fourth two-input NAND gate 312, followed by a second level including the fifth two-input NAND gate 318, and finally a third level including the sixth two-input NAND gate 322.

FIG. 4 depicts an implementation of the third RHL 108. In some implementations, the third RHL 108 includes a fourteenth reconfigurable inverter 402 of the plurality of reconfigurable inverters, a fifteenth reconfigurable inverter 404 of the plurality of reconfigurable inverters, a sixteenth reconfigurable inverter 406 of the plurality of reconfigurable inverters, a seventeenth reconfigurable inverter 408 of the plurality of reconfigurable inverters, an eighteenth reconfigurable inverter 410 of the plurality of reconfigurable inverters, a second two-input NOR gate 412, a third two-input NOR gate 414, a nineteenth reconfigurable inverter 416 of the plurality of reconfigurable inverters, a twentieth reconfigurable inverter 418 of the plurality of reconfigurable inverters, a first three-input NAND gate 420, a second three-input NAND gate 422, a fourth two-input NOR gate 424, and a twenty first reconfigurable inverter 426 of the plurality of reconfigurable inverters. The fourteenth reconfigurable inverter 402 may be associated with the first configuration cell M1, and receive the first input A. The fifteenth reconfigurable inverter 404 may be associated with the second configuration cell M2, and receive the fourth input D. The sixteenth reconfigurable inverter 406 may be associated with the third configuration cell M3, and receive the second input B. The seventeenth reconfigurable inverter 408 may be associated with the fourth configuration cell M4, and receive the third input C. The eighteenth reconfigurable inverter 410 may be associated with the fifth configuration cell M5, and receive the fourth input D. The second two-input NOR gate 412 may receive the third input C, and be coupled with the sixteenth reconfigurable inverter 406 to receive the output of the sixteenth reconfigurable inverter 406. The third two-input NOR gate 414 may receive the second input B, and be coupled with the seventeenth reconfigurable inverter 408 to receive the output of the seventeenth reconfigurable inverter 408. The nineteenth reconfigurable inverter 416 may be associated with the sixth configuration cell M6, and be coupled with the second two-input NOR gate 412 to receive the output of the second two-input NOR gate 412. The twentieth reconfigurable inverter 418 may be associated with the seventh configuration cell M7, and be coupled with the third two-input NOR gate 414 to receive the output of the third two-input NOR gate 414. The first three-input NAND gate 420 may be coupled with the fourteenth reconfigurable inverter 402, the fifteenth reconfigurable inverter 404, and the nineteenth reconfigurable inverter 416, to receive the outputs of the fourteenth reconfigurable inverter 402, the fifteenth reconfigurable inverter 404, and the nineteenth reconfigurable inverter 416. The second three-input NAND gate 422 may receive the first input A, and be coupled with the eighteenth reconfigurable inverter 410 and the twentieth reconfigurable inverter 418 to receive the outputs of the eighteenth reconfigurable inverter 410 and the twentieth reconfigurable inverter 418. The fourth two-input NOR gate 424 may be coupled with the first three-input NAND gate 420 and the second three-input NAND gate 422 to receive the outputs of the first three-input NAND gate 420 and the second three-input NAND gate 422. The twenty first reconfigurable inverter 426 may be associated with the eighth configuration cell M8, and be coupled with the fourth two-input NOR gate 424 to receive the output of the fourth two-input NOR gate 424. The output of the twenty first reconfigurable inverter 426 may be connected to the third output O3. Thus, in some implementations, the third RHL 108 can be viewed as a three-level logic, with a first level including the second two-input NOR gate 412 and the third two-input NOR gate 414, followed by a second level including the first three-input NAND gate 420 and the second three-input NAND gate 422, and finally a third level including the fourth two-input NOR gate 424.

Figure 5:
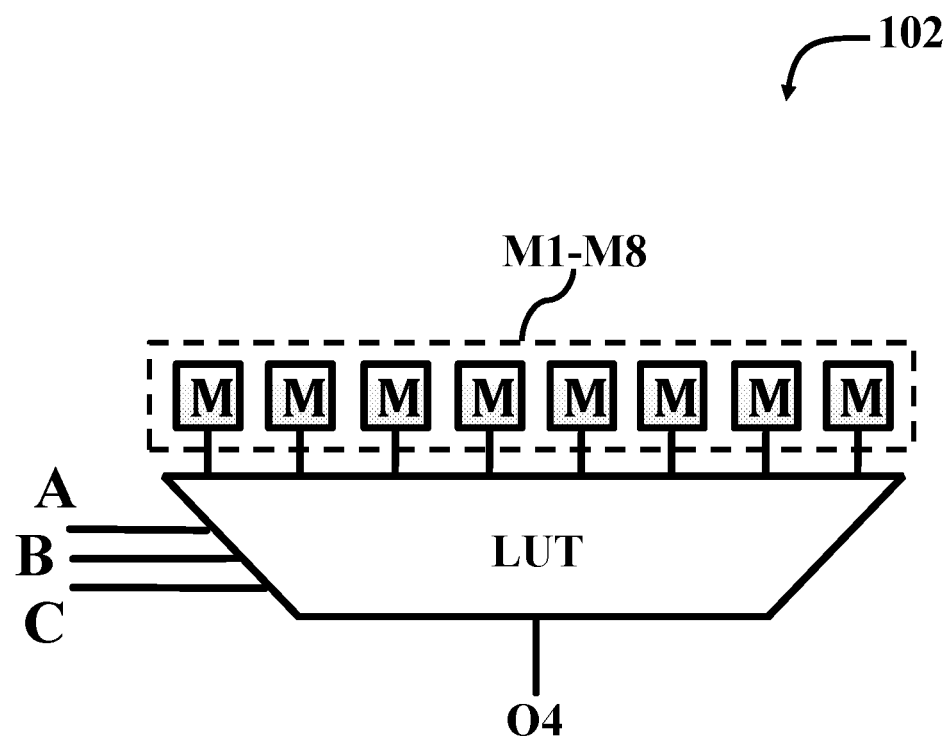
FIG. 5 illustrates an implementation of a three-input look-up table (LUT).

Further details regarding the LUT and the configuration cells are now presented with reference to FIGS. 1 and 5. FIG. 5 depicts an implementation of the LUT 102. In some implementations, the LUT 102 may be associated with the plurality of configuration cells M1-M8, and the output of the LUT may be connected to the fourth output O4.

Referring back to FIG. 1, in some implementations, the plurality of power gating cells S1-S4 may be configured to determine the power allocation for the logic modules in the PLU 100. In some examples, the plurality of power gating cells S1-S4 may be active-low. Therefore, a logical 0 in each of the plurality of power gating cells S1-S4 may determine that the associated logic module shall be activated. For example, S4=0 may indicate that the LUT 102 is active.

In different implementations, power may be provided for each module via a cut-off transistor. In one implementation, a first transistor Q1 is configured to couple the first RHL 104 with a power supply $V_{dd}$, in response to the first power gating cell S1 being active. Similarly, a second transistor Q2 may be configured to couple the second RHL 106 with the power supply $V_{dd}$, in response to the second power gating cell S2 being active. A third transistor Q3 may be configured to couple the third RHL 108 with the power supply $V_{dd}$, in response to the third power gating cell S3 being active. Furthermore, a fourth transistor Q4 may be configured to couple the LUT 102 with the power supply $V_{dd}$, in response to the fourth power gating cell S4 being active.

Generally, the total number of configuration cells in a PLU is equal to a sum of the configuration cells in each logic module in the PLU. However, because only one of the logic modules (the plurality of RHLs or the LUT 102) and its associated configuration cells may be active in a single implementation in the PLU 100, a shared set of configuration cells can be allocated for the logic modules, resulting in a smaller number of total configuration cells in the PLU 100. The potential benefits of this approach are at least two-fold. In one example, the significant reduction in the number of configuration cells improves the power efficiency of the PLU by throttling the leakage of power-gated configuration cells. In another example, such an approach reduces the area of the PLU. In addition, this scheme can be generalized for a higher number of logic modules and configuration cells.

Referring again to FIG. 1, in different implementations, the first RHL 104 may exploit only five of the plurality of configuration cells M1-M8 in its structure, whereas the other logic modules may be associated with all of the plurality of configuration cells M1-M8. The reduction in the number of configuration cells associated with the first RHL 104 is in part due to a lower number of logic gates in the first RHL 104, as well as a reduction of the number of reconfigurable inverters in the first RHL 104 that are associated with the plurality of inputs (the second input B and the third input C are not loaded into a reconfigurable inverter in the first RHL 104). Reducing the number of reconfigurable inverters can improve power efficiency by decreasing the area of the PLU 100, at the cost of a negligible impact on the function coverage ratio of the first RHL 104.

Through the use of only five configuration cells within the first RHL 104, three of the plurality of configuration cells M1-M8 can be powered off if the first RHL 104 is active in the PLU 100. This may be the case for more than about 60% of Boolean functions, resulting in a significant power saving for the PLU 100, particularly when compared to conventional four-input LUTs. Because power allocation for the logic modules may be determined by the plurality of power gating cells S1-S4, power gating for each of the plurality of configuration cells M1-M8 that is not associated with the first RHL 104 is determined by logical values of S2-S4. For the remaining of the plurality of configuration cells M1-M8 (that are also associated with the first RHL 104) the first power gating cell S1 may also be involved in power allocation.

In different implementations, the RPC 110 may be configured to activate the first configuration cell M1, the second configuration cell M2, the third configuration cell M3, the fourth configuration cell M4, and the fifth configuration cell M5, in response to the first power gating cell S1 being active. The RPC 110 may further be configured to activate the plurality of configuration cells M1-M8 in response to any of the second power gating cell S2, the third power gating cell S3, and the fourth power gating cell S4 being active. As a result, all of the plurality of configuration cells M1-M8, along with all of the logic modules, can be powered off by inactivating the plurality of power gating cells S1-S4.

Figure 6:
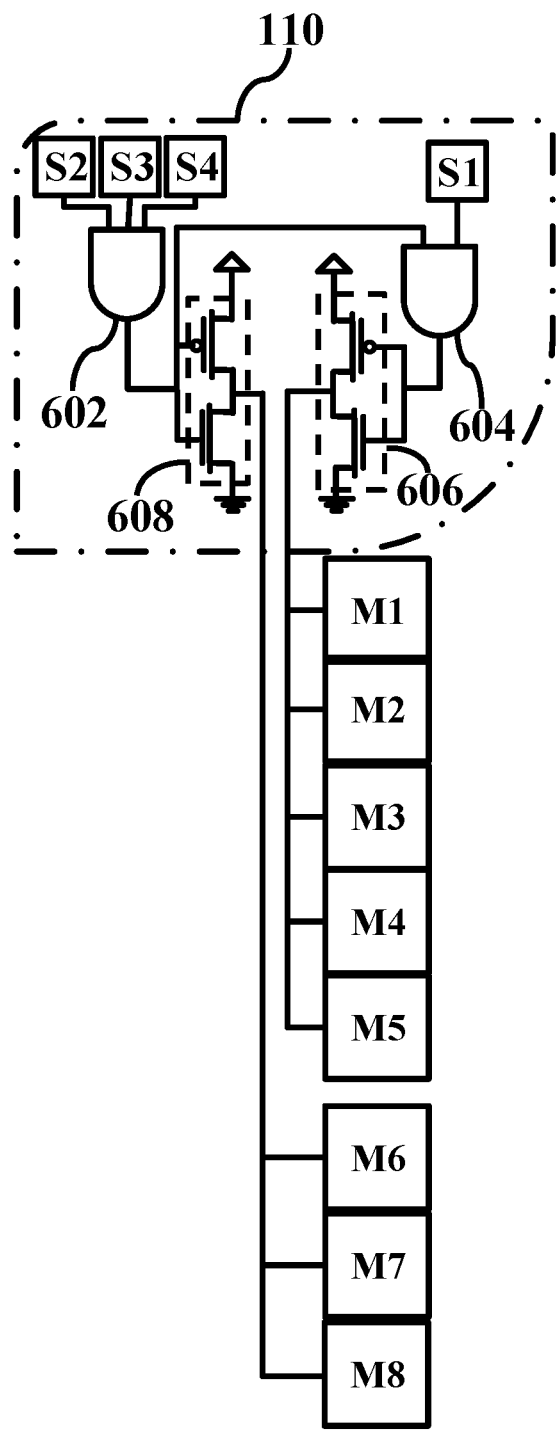
FIG. 6 illustrates an implementation of a reconfigurable power controller (RPC).

Referring next to FIG. 6, an implementation of the RPC 110 is depicted. In some implementations, the RPC 110 includes a three-input AND gate 602, a two-input AND gate 604, a first inverter 606, and a second inverter 608. The three-input AND gate 602 may be coupled with the second power gating cell S2, the third power gating cell S3, and the fourth power gating cell S4 to receive the values of the second power gating cell S2, the third power gating cell S3, and the fourth power gating cell S4. The two-input AND gate 604 may be coupled with the three-input AND gate 602 and the first power gating cell S1 to receive the output of the two-input AND gate 604 and the value of the first power gating cell S1. The first inverter 606 may be coupled with the two-input AND gate 604 to receive the output of the two-input AND gate 604. In addition, the output of the first inverter 606 may be loaded into each of the first configuration cell M1, the second configuration cell M2, the cell third configuration cell M3, the fourth configuration cell M4, and the fifth configuration cell M5. The second inverter 608 can be coupled with the three-input AND gate 602 to receive the output of the three-input AND gate 602. Furthermore, the output of the second inverter 608 may be loaded into each of the sixth configuration cell M6, the seventh configuration cell M7, and the eighth configuration cell M8. In one implementation, each of the plurality of power gating cells S1-S4 may include a static random-access memory (SRAM) cell. In another implementation, each of the plurality of configuration cells M1-M8 includes a SRAM cell.

Figure 7:
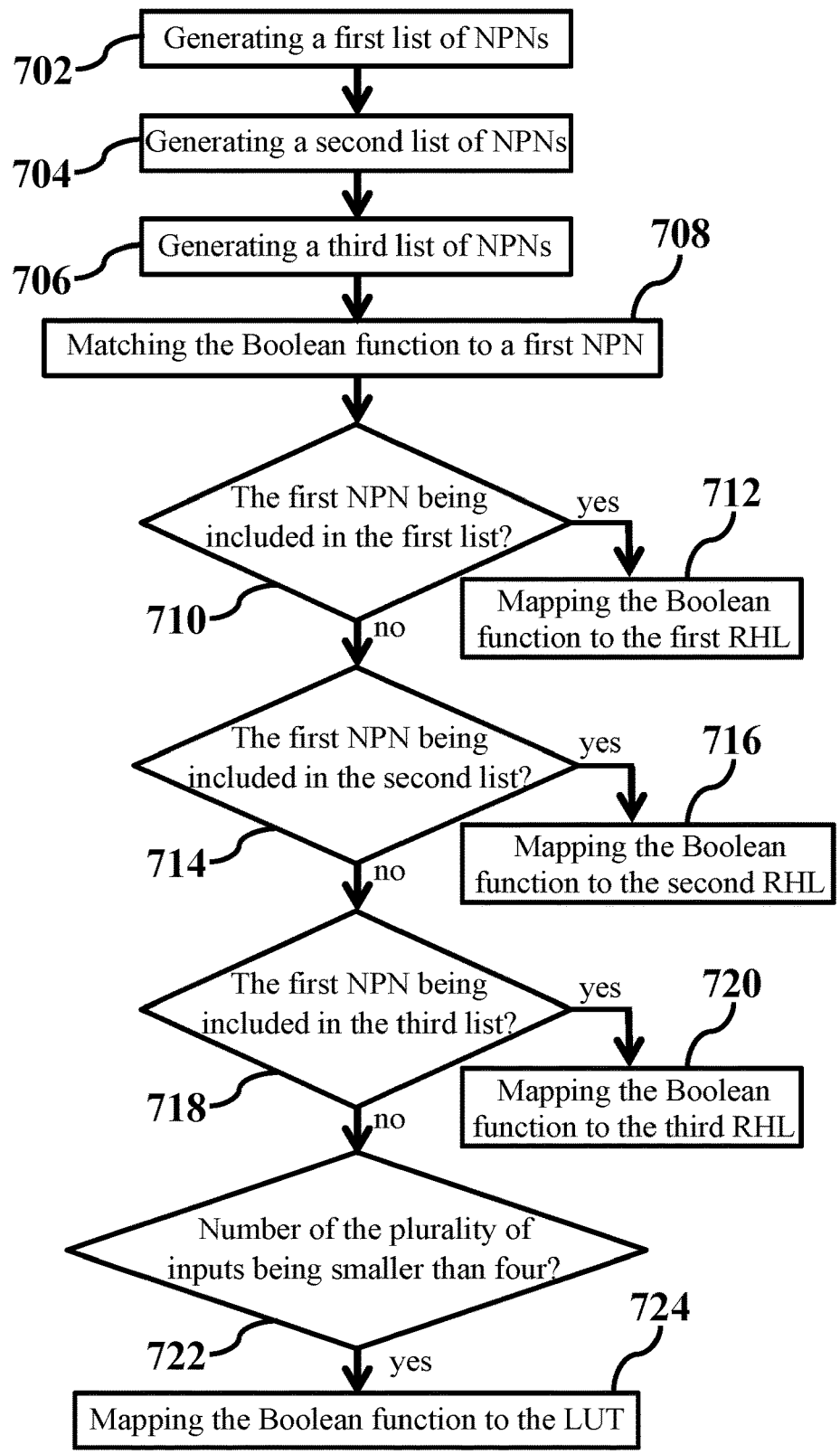
FIG. 7 illustrates an implementation of a method of mapping a Boolean function to a circuit.

FIG. 7 depicts an implementation of a method 700 for mapping a Boolean function 'F' of a plurality of inputs to a circuit. The circuit may include a plurality of programmable logic units (PLUs). In some implementations, each of the PLUs includes the first RHL 104, the second RHL 106, the third RHL 108, and the LUT 102. In general, the goal of mapping contemplates a variety of constraints, such as power, area, or delay optimization. The optimization goals of the method 700 may primarily include static and dynamic power reduction, as well as delay minimization. In some cases, a mapping method may be considered an optimal solution if the power is minimum. In some implementations, the PLU mapping is analogous with conventional LUT technology mapping, but can be optimized based on the specifications of the PLUs.

In different implementations, the method 700 may map the Boolean function F to the circuit based on a negating-permuting-negating (NPN) representation of the Boolean function. Through the use of the NPN representation, two different functions can be classified in the same NPN-class if each of them is obtained from the other by negating and/or permuting the inputs and/or negating the output of the other function. For example, two functions F=AB+CD and G=A$\overline{C}$+BD can be obtained from each other by permuting C and B and negating D.

As shown in FIG. 7, in some implementations, the method 700 involves generating a first list of negating-permuting-negating functions (NPNs) (a first step 702) corresponding to the first RHL 104, generating a second list of NPNs (a second step 704) corresponding to the second RHL 106, generating a third list of NPNs (a third step 706) corresponding to the third RI-IL 108, and matching the Boolean function F to a first NPN (a fourth step 708). Furthermore, the method includes mapping the Boolean function F to the first RHL 104 (a sixth step 712) in response to the first NPN being included in the first list (a fifth step 710, when 'yes'). If the first NPN is not included in the first list (fifth step 710, when 'no'), the method includes mapping the Boolean function F to the second RHL 106 (an eighth step 716) in response to the first NPN being included in the second list (a seventh step 714, when 'yes'). If the first NPN is not included in any of the first list and the second list (seventh step 714, when 'no'), the method includes mapping the Boolean function F to the third RHL 108 (a tenth step 720) in response to the first NPN being included in the third list (a ninth step 718, when 'yes'). If the first NPN is not included in any of the first list, the second list, and the third list (ninth step 718, when 'no'), and the number of the plurality of inputs is smaller than four (an eleventh step 722, when 'yes'), the method includes mapping the Boolean function F to the LUT (a twelfth step 724).

Furthermore, in some cases, generating the first list may include generating a first list of Boolean functions of the plurality of inputs A, B, C, D. The first list of Boolean functions may include: A×B×C×D, A×B×(C+D), and A×B+C×D, where × is a logical AND operator and + is a logical inclusive OR operator.

In addition, in some implementations, generating the second list may include generating a second list of Boolean functions. The second list of Boolean functions may include: A×(!B×C+B×D), A×(B+C×D), A×(B+C+D), and A×(B⊕C), where ! is a logical negation operator, × is a logical AND operator, + is a logical inclusive OR operator, and ⊕ is a logical exclusive OR operator.

Similarly, in some cases, generating the third list may include generating a third list of Boolean functions. The third list of Boolean functions may include: A×B×C×D+!(A×B)×!C×D, A×B×(C ⊕D), A×(B⊕C+D), A×(B×C+B×D+C×D), !A×!B×!C+A×B×C, A×B×(C+D)+!A×!B×!C×!D, A×B×C+!B×!C, (A⊕B)+C×D, A×(B×!C×D+!B×C×!D), A×B×C×D+!A×!B×!C×!D, !A×!B×C×D+(A⊕B)×!C×!D, and A×B×C+!A×!B×!C+B×C×!D+!B×!C×D, where ! is a logical negation operator, × is a logical AND operator, + is a logical inclusive OR operator, and ⊕ is a logical exclusive OR operator.

TABLE 1 presented below summarizes the coverage ratio of four-input and three-input functions by each of the NPN classes corresponding to the Boolean functions in the first list, the second list, and the third list. The supporting logic unit for each NPN, that is the first RHL 104 (referred to as $RHL_1$ in TABLE 1), the second RHL 106 (referred to as $RHL_2$ in TABLE 1), the third RHL 108 (referred to as $RHL_3$ in TABLE 1), and the LUT 102 for each NPN class, is also designated by a check mark in TABLE 1. The coverage ratios are determined based on a comprehensive range of standard and industrial benchmarks. As illustrated in TABLE 1, the plurality of RHLs along with the LUT 102 may be able to implement more than about 95.5% of most-frequent NPNs. Several other NPNs in addition to those presented in TABLE 1 are also supported by the plurality of PHLs and the LUT 102. However, their utilization rate is trivial and is not reported in TABLE 1 for the sake of brevity. According to TABLE 1, there are some NPNs with three or less inputs that are covered by both the third RHL 108 and the LUT 102. In such cases, the third RHL 108 may be chosen over the LUT 102 to implement those functions due to the better power efficiency of third RHL 108 over the LUT 102.

TABLE 1

Coverage ratio of NPNs supported by the plurality of RHLs and the LUT

| NPN | Coverage Ratio (%) | $RHL_1$ | $RHL_2$ | $RHL_3$ | LUT |
|---|---|---|---|---|---|
| ABCD | 34.0 | ✓ | | | |
| AB(C + D) | 14.4 | ✓ | | | |
| AB + CD | 13.5 | ✓ | | | |
| A(!BC + BD) | 8.6 | | ✓ | | |
| A(B + CD) | 7.0 | | ✓ | | |
| A(B + C + D) | 5.1 | | ✓ | | |
| ABCD + !(AB)!CD | 4.4 | | | ✓ | |
| AB + AC + BC | 1.6 | | | | ✓ |
| A(B ⊕ C) | 1.2 | | | ✓ | ✓ |
| AB(C ⊕ D) | 1.0 | | | ✓ | |
| A⊕B⊕C | 0.9 | | | | ✓ |
| A(B ⊕ C + D) | 0.9 | | | ✓ | |
| A(BC + BD + CD) | 0.6 | | | ✓ | |
| !A!B!C + ABC | 0.5 | | | ✓ | ✓ |
| AB(C + D) + !A!B!C!D | 1.6 (shared) | | | ✓ | |
| ABC + !B!C | | | | ✓ | ✓ |
| (A ⊕ B) + CD | | | | ✓ | |
| A(B!CD + !BC!D) | | | | ✓ | |
| ABCD + !A!B!C!D | | | | ✓ | |
| !A!BCD + (A ⊕ B)!C!D | | | | ✓ | |
| ABC + !A!B!C + BC!D + !B!CD | | | | ✓ | |
| Other supported NPNs | | | | ✓ | |
| Unsupported NPNs | | | | | |

Figure 8:
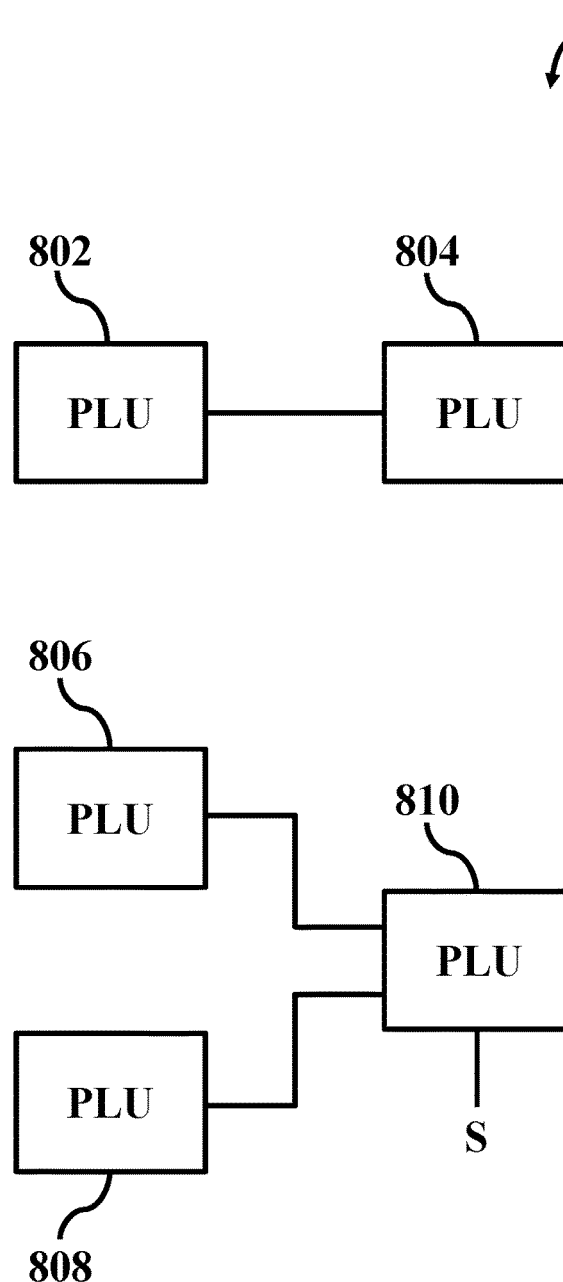
FIG. 8 illustrates an implementation of the circuit, including a plurality of PLUs.

Referring now to FIG. 8, an implementation of a circuit 800 is schematically illustrated. In one implementation, the circuit 800 includes a first PLU 802 and a second PLU 804 of the plurality of PLUs. The second PLU 804 is coupled with the first PLU 802 to receive the output of the first PLU 802. In another implementation, the circuit 800 may include a third PLU 806, a fourth PLU 808, and a fifth PLU 810 of the plurality of PLUs. The fifth PLU 810 may be coupled with the third PLU 806 and the fourth PLU 808 to receive the outputs of the third PLU 806 and the fourth PLU 808. In some cases, as described below, multiple PLUs can be utilized for implementing Boolean functions that are not supported by any of the plurality of RHLs and the LUT 102, and hence cannot be implemented in a single PLU.

In different implementations, the method 700 may further include mapping the Boolean function F to the first PLU 802 and the second PLU 804, in response to the Boolean function meeting a decomposition condition, and mapping the Boolean function F to the third PLU 806, the fourth PLU 808, and the fifth PLU 810, in response to the Boolean function not meeting the decomposition condition. The decomposition condition may determine whether the Boolean function F can be implemented by cascading two PLUs. In different implementations, mapping the Boolean function F to the first PLU 802 and the second PLU 804 may further include (1) decomposing the Boolean function F into a series of two sub-functions including a first sub-function $F_1$ and a second sub-function $F_2$, (2) matching the first sub-function $F_1$ to a second NPN, (3) matching the second sub-function $F_2$ to a third NPN, and (4) mapping the Boolean function F to the first PLU 802 and the second PLU 804 in response to the Boolean function meeting the decomposition condition. The first sub-function $F_1$ may include a plurality of first sub-function inputs and a first sub-function output. The second sub-function $F_2$ may receive the first sub-function output.

In some implementations, the decomposition condition may include a first sub-condition and one of a second sub-condition and a third sub-condition. The first sub-condition may include the third NPN being included in one of the first list, the second list, and the third list, indicating that the second sub-function $F_2$ can be implemented by (at least) one of the plurality of RHLs. The second sub-condition may include the second NPN being included in one of the first list, the second list, and the third list, indicating that the first sub-function $F_1$ can be implemented by (at least) one of the plurality of RHLs. The third sub-condition may include the number of the plurality of first sub-function inputs being smaller than four, indicating that the first sub-function $F_1$ can be implemented by the LUT 102.

Figure 9:
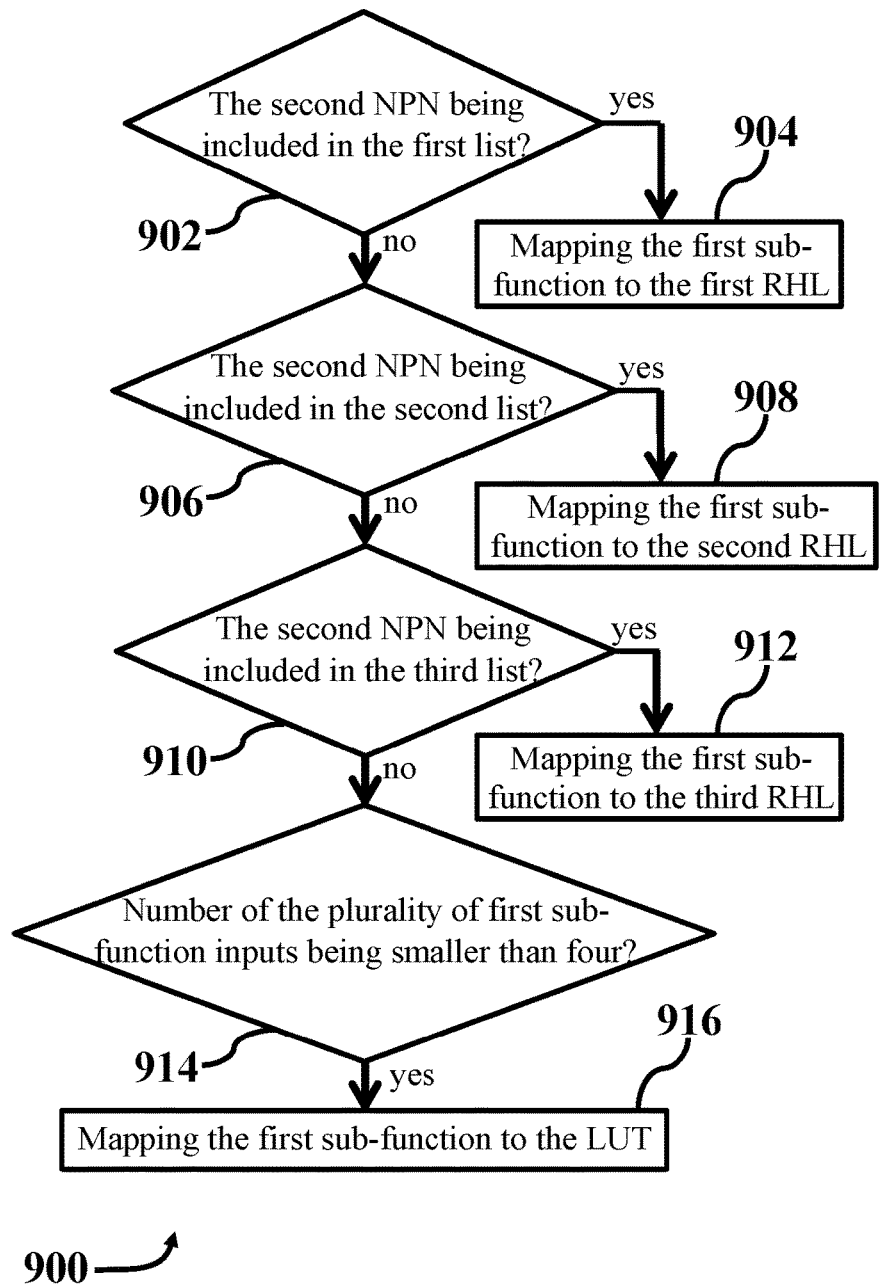
FIG. 9 is a flowchart depicting an implementation of a mapping of the Boolean function to a first PLU.

FIG. 9 is a flowchart 900 presenting an implementation of mapping the Boolean function to the first PLU 802 of FIG. 8. In some implementations, mapping the Boolean function to the first PLU 802 includes mapping the first sub-function to the first RHL 104 (a second step 904) in response to the second NPN being included in the first list (a first step 902, when 'yes'). If the second NPN is not included in the first list (the first step 904, when 'no') and is included in the second list (a third step 906, when 'yes'), the method includes mapping the first sub-function to the second RHL 106 (a fourth step 908). In addition, if the second NPN is not included in any of the first list and the second list (the third step 906, when 'no') and is included in the third list (a fifth step 910, when 'yes'), the method includes mapping the first sub-function to the third RHL 108 (a sixth step 912). If the second NPN is not included in any of the first list, the second list, and the third list (the fifth step 910, when 'no'), and the number of the plurality of first sub-function inputs is smaller than four (a seventh step 914, when 'yes'), the method includes mapping the first sub-function to the LUT 102 (an eighth step 916).

Figure 10:
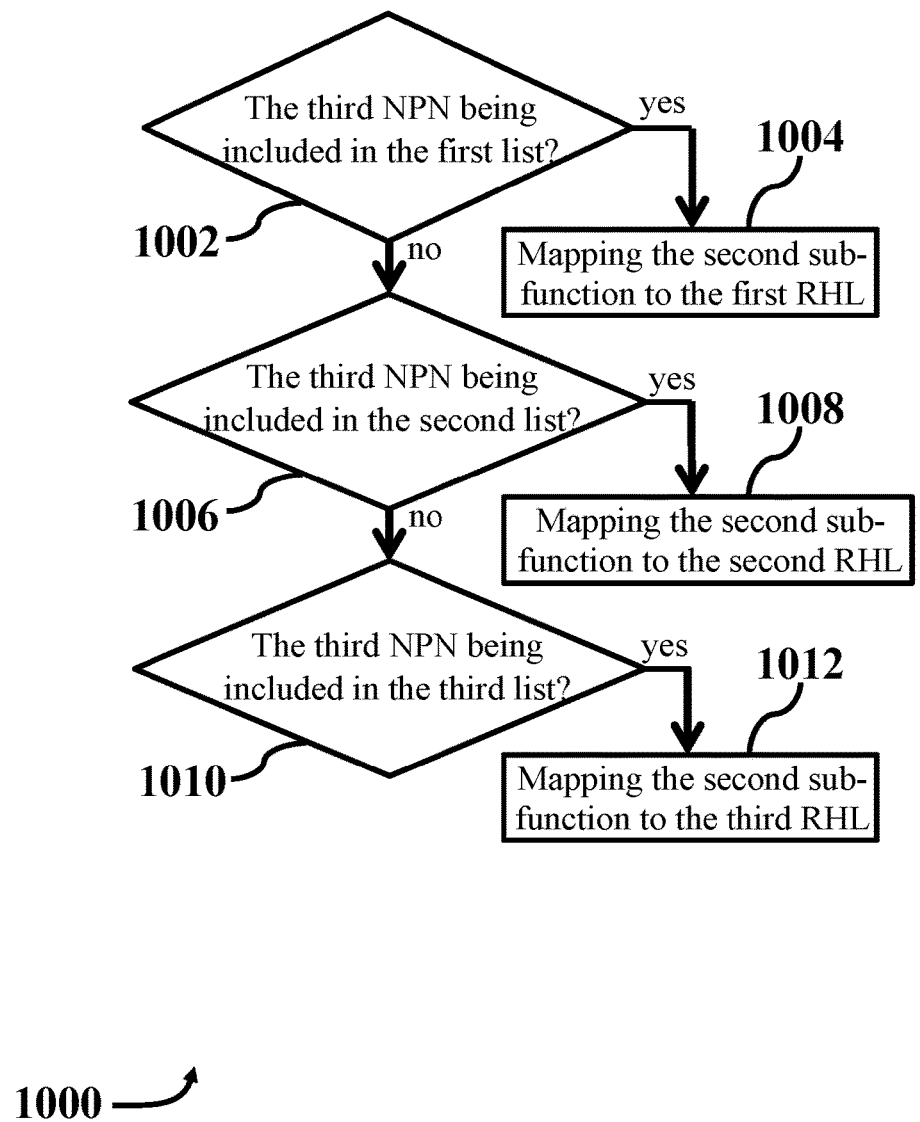
FIG. 10 is a flowchart depicting an implementation of a mapping of the Boolean function to a second PLU.

FIG. 10 is a flowchart 1000 presenting an implementation of mapping the Boolean function to the second PLU 804 of FIG. 8. In some implementations, mapping the Boolean function to the second PLU 804 may include mapping the second sub-function to the first RHL 104 (a second step 1004) in response to the third NPN being included in the first list (a first step 1002, when 'yes'). In addition, when the third NPN is not included in the first list (the first step 1002, when 'no') and is included in the second list (a third step 1006, when 'yes'), the method includes mapping the second sub-function to the second RHL 106 (a fourth step 1008). Furthermore, if the third NPN is not included in any of the first list and the second list (the third step 1008, when 'no') and is included in the third list (a fifth step 1010, when 'yes'), the method includes mapping the second sub-function to the third RHL 108 (a sixth step 1012).

If the Boolean function F cannot be implemented by cascading two PLUs, it may be implemented by three PLUs by decomposing the Boolean function F to a pair of cofactors using the Shannon decomposition. This is expressed by $$F = !x_i \cdot F(x_0, \ldots, x_{i-1}, 0, \ldots, x_n) + x_i \cdot F(x_1, \ldots, x_{i-1}, 1, \ldots, x_n)$$ Equation (1)

where $x_0$-$x_n$ are inputs of the Boolean function F. According to Equation (1) a 4-input function can be implemented using two 3-input functions (which can be implemented by one of the plurality of RHLs or the LUT 102) and a 2-to-1 multiplexer (with input $x_i$ as a selector input). To choose the most efficient function pair, the decomposition of Equation (1) may be performed on all of the four input variables and the pair that can be implemented on the logic units (from the plurality of RHLs and the LUT 102) with better power efficiency and shorter delay may be selected. For example, the first RHL 104 may be preferred over the second RHL 106, and the second RHL 106 may be preferred over the third RHL 108. If either of the cofactors (with three or less inputs) cannot be implemented by any of the plurality of RHLs, it may be mapped to the LUT 102.

Referring again to FIG. 8, in some implementations, mapping the Boolean function to the third PLU 806, the fourth PLU 808, and the fifth PLU 810 may include decomposing the Boolean function into a pair of cofactors including a first cofactor and a second cofactor, mapping the first cofactor to the third PLU 806, mapping the second cofactor to the fourth PLU 808, and configuring the fifth PLU 810 to function as a two-to-one multiplexer. In some implementations, configuring the fifth PLU 810 may include configuring the first RHL 104 to function as the two-to-one multiplexer, due to a better power efficiency of the first RHL 104. The two-to-one multiplexer may receive one of the plurality of inputs as a selector input S of the multiplexer.

Figure 11:
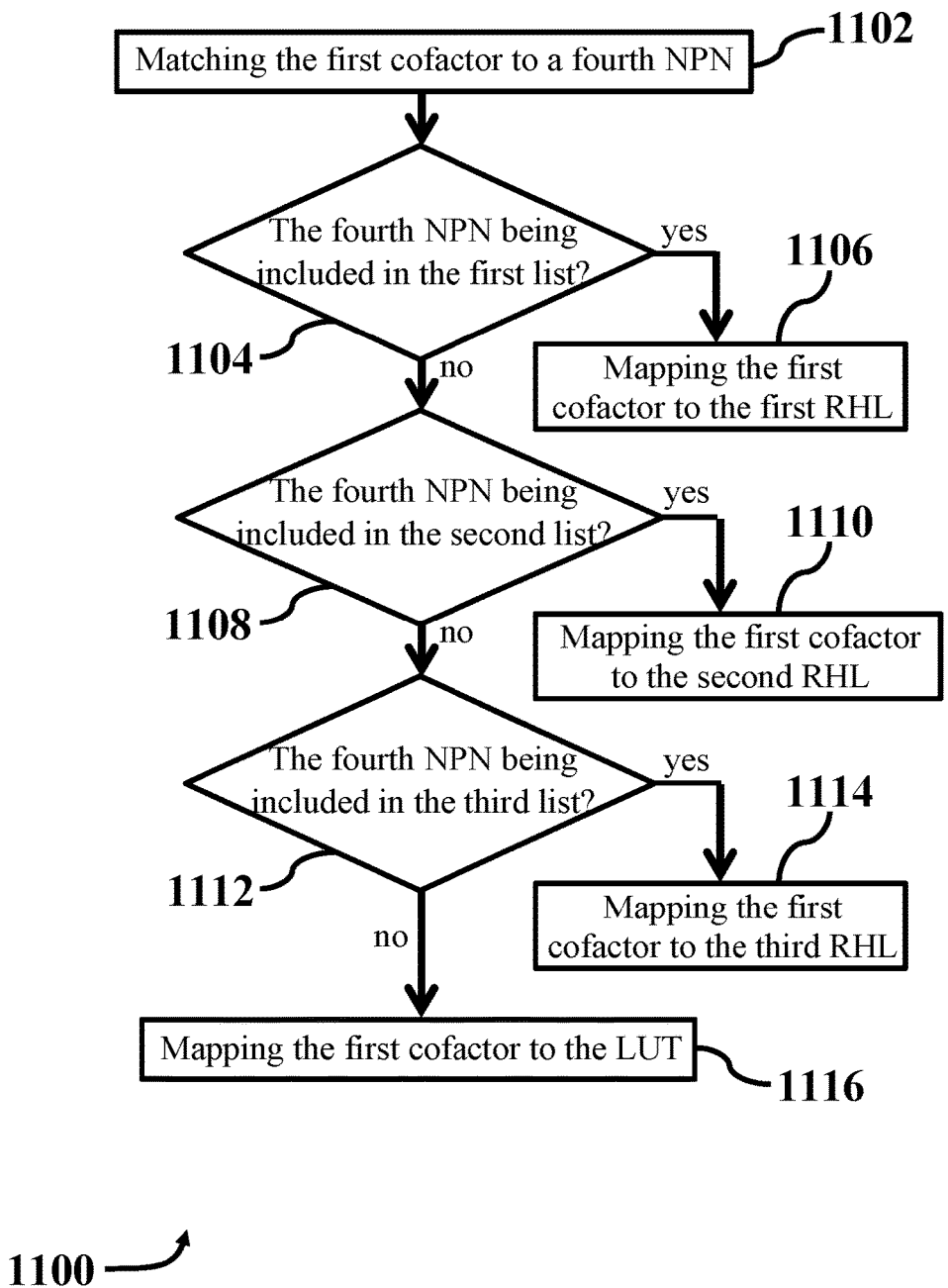
FIG. 11 is a flowchart depicting an implementation of a mapping of a first cofactor to a third PLU.

FIG. 11 is a flowchart 1100 presenting an implementation of mapping the first cofactor to the third PLU 806. In some implementations, mapping the first cofactor to the third PLU 806 includes matching the first cofactor to a fourth NPN (a first step 1102). In addition, the method can include mapping the first cofactor to the first RHL 104 (a third step 1106) in response to the fourth NPN being included in the first list (a second step 1106, when 'yes'). If the fourth NPN is not included in the first list (second step 1104, when 'no') and is included in the second list (a fourth step 1108, when 'yes') the method includes mapping the first cofactor to the second RHL 106 (a fifth step 1110). In addition, if the fourth NPN is not included in any of the first list and the second list (the fourth step 1108, when 'no') and is included in the third list (a sixth step 1112, when 'yes'), the method includes mapping the first cofactor to the third RHL 108 (a seventh step 1114). Finally, if the fourth NPN is not included in any of the first list, the second list, and the third list (the sixth step 1112, when 'no'), the method includes mapping the first cofactor to the LUT 102 (an eighth step 1116).

Figure 12:
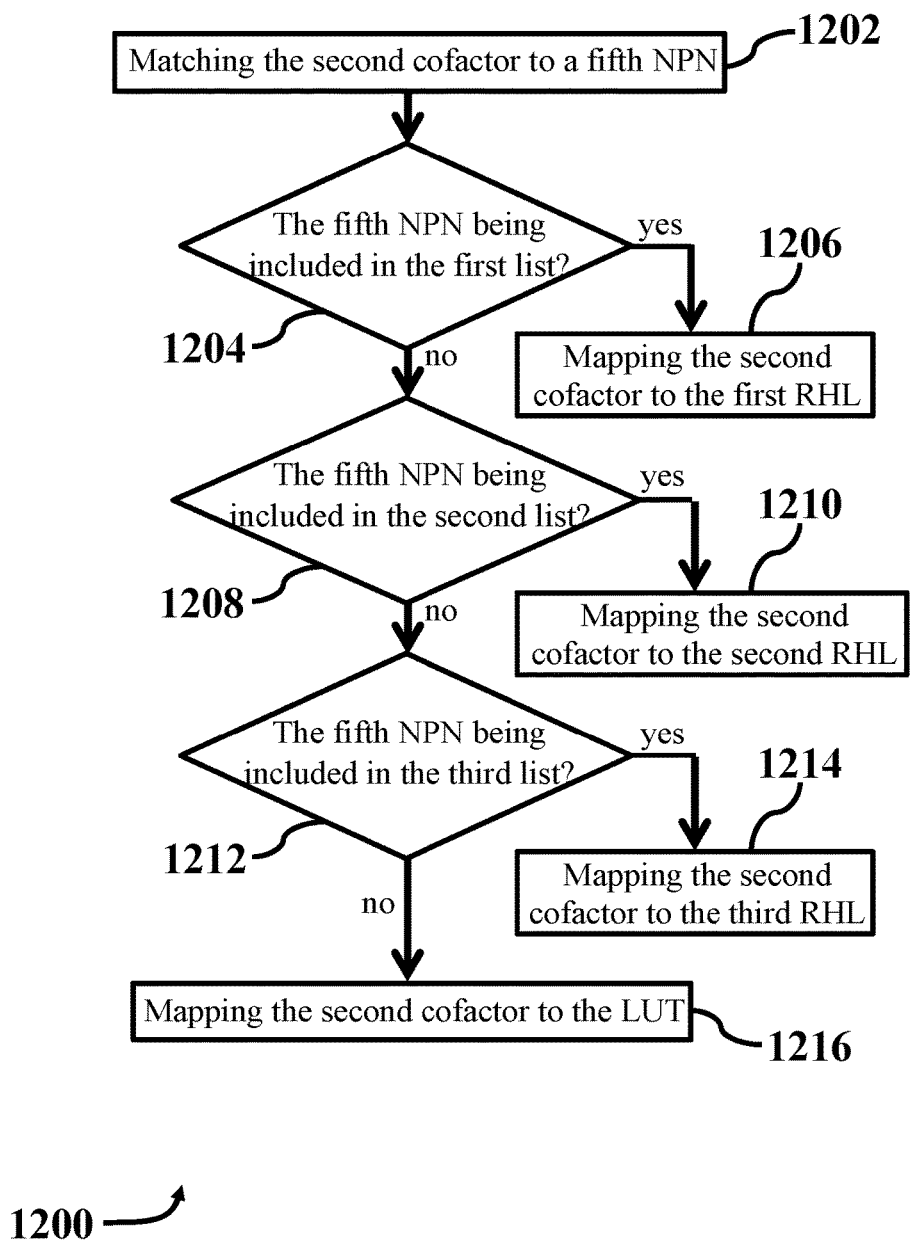
FIG. 12 is a flowchart depicting an implementation of a mapping of a second cofactor to a fourth PLU.

FIG. 12 is a flowchart 1200 presenting an implementation of mapping the second cofactor to the fourth PLU 808 of FIG. 8. In some implementations, mapping the second cofactor to the fourth PLU 808 includes matching the second cofactor to a fifth NPN (a first step 1202). In addition, the method includes mapping the second cofactor to the first RHL 104 (a third step 1206) in response to the fifth NPN being included in the first list (a second step 1204, when 'yes'). If the fifth NPN is not included in the first list (the second step 1204, when 'no') and is included in the second list (a fourth step 1208, when 'yes') the method includes mapping the second cofactor to the second RHL 106 (a fifth step 1210). Furthermore, if the fifth NPN is not included in any of the first list and the second list (the fourth step 1208, when 'no') and is included in the third list (a sixth step 1212, when 'yes'), the method involves mapping the second cofactor to the third RHL 108 (a seventh step 1214). Finally, if the fifth NPN is not included in any of the first list, the second list, and the third list (the sixth step 1212, when 'no'), the method will include mapping the second cofactor to the LUT 102 (an eighth step 1216).

Example: A Simulated PLU

An example PLU, including implementations of the RHLs and the LUT, was simulated by transistor-level HSPICE simulations with a 45 nm high performance Predictive Technology Model (PTM) library. TABLE 2 below presents the propagation delay of each logic module in the simulated PLU, as well as the delays of a conventional four-input LUT (referred to as 4-LUT in TABLE 2) and a conventional 6-input LUT (referred to as 6-LUT in TABLE 2). The delay of each module is the average delay of its different inputs. As shown in TABLE 2, the RHLs correspond to smaller critical path delays than those of the LUTs.

TABLE 2

Propagation delays of logic modules in the simulated PLU and conventional LUTs.

| Module | Delay (ps) |
| --- | --- |
| $RHL_1$ | 78 |
| $RHL_2$ | 105 |
| $RHL_3$ | 98 |
| LUT | 123 |
| 4-LUT | 172 |
| 6-LUT | 207 |

In addition, TABLE 3 below presents the power dissipation of the RHLs and the LUTs in terms of both static and dynamic forms. The values were obtained by transistor-level HSPICE simulations with a 45 nm PTM library, below a temperature of about 65° C. In the simulated PLU example, when a module was active, leakage power of the other power gated modules was also considered. The power of the modules was also reported in their power gated state. When the simulated PLU was entirely power gated, it consumed about 192 nW. However, the 4-LUT dissipated about 418 nW in the power gated state due to its large input drivers and higher number of configuration cells. The dynamic power of the modules was calculated assuming an input frequency of 100 MHz with a switching probability $\alpha=1$. As shown in TABLE 3, the RHLs and the LUT in the simulated PLU dissipated significantly less power than the conventional 4-LUT and 6-LUT. This superiority in static power was primarily due to the use of a small number of configuration cells by exploitation of an implementation of the disclosed scheme for sharing configuration cells, and replacement of the 4-LUT with the smaller LUT. In addition, the substantially higher dynamic powers of the 4-LUT and the 6-LUT architectures can be understood to be attributed to the inefficient tree-structure of multiplexers in these LUTs with large buffers and pass-gates with large parasitic capacitances.

TABLE 3

Power dissipation of logic modules in the simulated PLU and conventional LUTs.

| Module | Static Power ON state (nW) | Static Power OFF state (nW) | Dynamic Power (nW) |
| --- | --- | --- | --- |
| $RHL_1$ | 406 | 192 | 242 |
| $RHL_2$ | 601 | | 308 |
| $RHL_3$ | 801 | | 386 |
| LUT | 746 | | 1098 |
| 4-LUT | 2388 | 418 | 1639 |
| 6-LUT | 5769 | 845 | 3112 |

Furthermore, TABLE 4 is provided below to indicate the area of each logic module in the simulated PLU and the conventional LUTs in terms of the number of configuration cells and the minimum-width transistor count. As shown in TABLE 4, the area of each RHL or the LUT is considerably less than that of the 4-LUT and the 6-LUT.

TABLE 4

Area of each logic module in the simulated PLU and the conventional LUTs

| Module | Configuration Cells | Min. Width Transistor Count |
| --- | --- | --- |
| $PHL_1$ | 5 | 72 |
| $PHL_2$ | 8 | 114 |
| $PHL_3$ | 8 | 120 |
| LUT | 8 | 126 |
| 4-LUT | 16 | 264 |
| 6-LUT | 64 | 940 |

The RHLs and PLUs that are disclosed herein may be considered to provide fundamental blocks in upcoming FPGAs, and can be exploited in various programmable devices. In one implementation, the disclosed PLUs may be implemented in shadow-cluster based designs or along with the ASIC-based digital signal processing blocks (DSPs) such as single-port or dual-port RAMs and multipliers which are common in industrial FPGAs. In a shadow-cluster based design, a secondary hard-wired basic block such as a DSP may exist in the same cluster with a PLU or a LUT. By employing techniques disclosed herein, when a hard logic block is not used, the soft logic can be programmed and exploited.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A programmable logic unit (PLU), comprising:
a plurality of inputs, including a first input, a second input, a third input, and a fourth input;
a plurality of outputs, including a first output, a second output, a third output, and a fourth output;
a plurality of power gating cells, including a first power gating cell, a second power gating cell, a third power gating cell, and a fourth power gating cell;
a plurality of configuration cells, including a first configuration cell, a second configuration cell, a third configuration cell, a fourth configuration cell, a fifth configuration cell, a sixth configuration cell, a seventh configuration cell, and an eighth configuration cell;
a reconfigurable power controller (RPC);
a plurality of four-input reconfigurable hard logics (RHLs), including a first RHL, a second RHL, and a third RHL;
a three-input look-up-table (LUT); and
a plurality of reconfigurable inverters associated with the plurality of RHLs;
wherein the first RHL includes:
a first reconfigurable inverter of the plurality of reconfigurable inverters, the first reconfigurable inverter associated with the first configuration cell, the first reconfigurable inverter arranged to receive the first input;
a second reconfigurable inverter of the plurality of reconfigurable inverters, the second reconfigurable inverter associated with the second configuration cell, the second reconfigurable inverter arranged to receive the fourth input;
a first two-input NAND gate arranged to receive the second input and coupled with the first reconfigurable inverter to receive the output of the first reconfigurable inverter;
a first two-input NOR gate arranged to receive the third input and coupled with the second reconfigurable inverter to receive the output of the second reconfigurable inverter;
a third reconfigurable inverter of the plurality of reconfigurable inverters, the third reconfigurable inverter associated with the third configuration cell, the third reconfigurable inverter coupled with the first two-input NAND gate to receive the output of the first two-input NAND gate;
a fourth reconfigurable inverter of the plurality of reconfigurable inverters, the fourth reconfigurable inverter associated with the fourth configuration cell, the fourth reconfigurable inverter coupled with the first two-input NOR gate to receive the output of the first two-input NOR gate;
a second two-input NAND gate coupled with the third reconfigurable inverter and the fourth reconfigurable inverter to receive the outputs of the third reconfigurable inverter and the fourth reconfigurable inverter; and
a fifth reconfigurable inverter of the plurality of reconfigurable inverters, the fifth reconfigurable inverter associated with the fifth configuration cell, the fifth reconfigurable inverter coupled with the second two-input NAND gate to receive the output of the second two-input NAND gate, the output of the fifth reconfigurable inverter connected to the first output.

2. The PLU of claim 1, wherein the second RHL includes:
a sixth reconfigurable inverter of the plurality of reconfigurable inverters, the sixth reconfigurable inverter associated with the first configuration cell, the sixth reconfigurable inverter arranged to receive the first input;
a seventh reconfigurable inverter of the plurality of reconfigurable inverters, the seventh reconfigurable inverter associated with the second configuration cell, the second reconfigurable inverter arranged to receive the second input;
an eighth reconfigurable inverter of the plurality of reconfigurable inverters, the eighth reconfigurable inverter associated with the third configuration cell, the eighth reconfigurable inverter arranged to receive the third input;
a ninth reconfigurable inverter of the plurality of reconfigurable inverters, the ninth reconfigurable inverter associated with the fourth configuration cell, the ninth reconfigurable inverter arranged to receive the fourth input;
a third two-input NAND gate arranged to receive the third input and coupled with the seventh reconfigurable inverter to receive the output of the seventh reconfigurable inverter;
a fourth two-input NAND gate coupled with the eighth reconfigurable inverter and the ninth reconfigurable inverter to receive the outputs of the eighth reconfigurable inverter and the ninth reconfigurable inverter;
a tenth reconfigurable inverter of the plurality of reconfigurable inverters, the tenth reconfigurable inverter associated with the fifth configuration cell, the tenth reconfigurable inverter coupled with the third two-input NAND gate to receive the output of the third two-input NAND gate;
an eleventh reconfigurable inverter of the plurality of reconfigurable inverters, the eleventh reconfigurable inverter associated with the sixth configuration cell, the eleventh reconfigurable inverter coupled with the fourth two-input NAND gate to receive the output of the fourth two-input NAND gate;
a fifth two-input NAND gate coupled with the tenth reconfigurable inverter and the eleventh reconfigurable inverter to receive the outputs of the tenth reconfigurable inverter and the eleventh reconfigurable inverter;
a twelfth reconfigurable inverter of the plurality of reconfigurable inverters, the twelfth reconfigurable inverter associated with the seventh configuration cell, the twelfth reconfigurable inverter coupled with the fifth two-input NAND gate to receive the output of the fifth two-input NAND gate;
a sixth two-input NAND gate coupled with the sixth reconfigurable inverter and the twelfth reconfigurable inverter to receive the outputs of the sixth reconfigurable inverter and the twelfth reconfigurable inverter; and
a thirteenth reconfigurable inverter of the plurality of reconfigurable inverters, the thirteenth reconfigurable inverter associated with the eighth configuration cell, the thirteenth reconfigurable inverter coupled with the sixth two-input NAND gate to receive the output of the sixth two-input NAND gate, the output of the thirteenth reconfigurable inverter connected to the second output.

3. The PLU of claim 1, wherein the third RHL includes:
a fourteenth reconfigurable inverter of the plurality of reconfigurable inverters, the fourteenth reconfigurable inverter associated with the first configuration cell, the fourteenth reconfigurable inverter arranged to receive the first input;
a fifteenth reconfigurable inverter of the plurality of reconfigurable inverters, the fifteenth reconfigurable inverter associated with the second configuration cell, the fifteenth reconfigurable inverter arranged to receive the fourth input;
a sixteenth reconfigurable inverter of the plurality of reconfigurable inverters, the sixteenth reconfigurable inverter associated with the third configuration cell, the sixteenth reconfigurable inverter arranged to receive the second input;
a seventeenth reconfigurable inverter of the plurality of reconfigurable inverters, the seventeenth reconfigurable inverter associated with the fourth configuration cell, the seventeenth reconfigurable inverter arranged to receive the third input;
an eighteenth reconfigurable inverter of the plurality of reconfigurable inverters, the eighteenth reconfigurable inverter associated with the fifth configuration cell, the eighteenth reconfigurable inverter arranged to receive the fourth input;
a second two-input NOR gate arranged to receive the third input and coupled with the sixteenth reconfigurable inverter to receive the output of the sixteenth reconfigurable inverter;
a third two-input NOR gate arranged to receive the second input and coupled with the seventeenth reconfigurable inverter to receive the output of the seventeenth reconfigurable inverter;
a nineteenth reconfigurable inverter of the plurality of reconfigurable inverters, the nineteenth reconfigurable inverter associated with the sixth configuration cell, the nineteenth reconfigurable inverter coupled with the second two-input NOR gate to receive the output of the second two-input NOR gate;
a twentieth reconfigurable inverter of the plurality of reconfigurable inverters, the twentieth reconfigurable inverter associated with the seventh configuration cell, the twentieth reconfigurable inverter coupled with the third two-input NOR gate to receive the output of the third two-input NOR gate;
a first three-input NAND gate coupled with the fourteenth reconfigurable inverter, the fifteenth reconfigurable inverter, and the nineteenth reconfigurable inverter, to receive the outputs of the fourteenth reconfigurable inverter, the fifteenth reconfigurable inverter, and the nineteenth reconfigurable inverter;
a second three-input NAND gate arranged to receive the first input and coupled with the eighteenth reconfigurable inverter and the twentieth reconfigurable inverter to receive the outputs of the eighteenth reconfigurable inverter and the twentieth reconfigurable inverter;
a fourth two-input NOR gate coupled with the first three-input NAND gate and the second three-input NAND gate to receive the outputs of the first three-input NAND gate and the second three-input NAND gate; and
a twenty first reconfigurable inverter of the plurality of reconfigurable inverters, the twenty first reconfigurable inverter associated with the eighth configuration cell, the twenty first reconfigurable inverter coupled with the fourth two-input NOR gate to receive the output of the fourth two-input NOR gate, the output of the twenty first reconfigurable inverter connected to the third output.

4. The PLU of claim 1, wherein the LUT is associated with the plurality of configuration cells, and the output of the LUT is connected to the fourth output.

5. The PLU of claim 1, wherein:
a first transistor is configured to couple the first RHL with a power supply in response to the first power gating cell being active;
a second transistor is configured to couple the second RHL with the power supply in response to the second power gating cell being active;
a third transistor is configured to couple the third RHL with the power supply in response to the third power gating cell being active; and
a fourth transistor is configured to couple the LUT with the power supply in response to the fourth power gating cell being active.

6. The PLU of claim 1, wherein:
the reconfigurable power controller is configured to activate the first configuration cell, the second configuration cell, the third configuration cell, the fourth configuration cell, and the fifth configuration cell in response to the first power gating cell being active; and
the reconfigurable power controller is configured to activate the plurality of configuration cells in response to any of the second power gating cell, the third power gating cell, and the fourth power gating cell being active.

7. The PLU of claim 1, wherein the reconfigurable power controller includes:
a three-input AND gate coupled with the second power gating cell, the third power gating cell, and the fourth power gating cell, for receiving the values of the second power gating cell, the third power gating cell, and the fourth power gating cell;
a two-input AND gate coupled with the three-input AND gate and the first power gating cell, to receive the output of the two-input AND gate and the value of the first power gating cell;
a first inverter coupled with the two-input AND gate to receive the output of the two-input AND gate, the output of the first inverter loaded into each of the first configuration cell, the second configuration cell, the third configuration cell, the fourth configuration cell, and the fifth configuration cell; and
a second inverter coupled with the three-input AND gate to receive the output of the three-input AND gate, the output of the second inverter loaded into each of the sixth configuration cell, the seventh configuration cell, and the eighth configuration cell.

8. The PLU of claim 1, wherein each of the plurality of power gating cells includes a static random-access memory (SRAM) cell.

9. The PLU of claim 1, wherein each of the plurality of configuration cells includes a static random-access memory (SRAM) cell.

10. The PLU of claim 1, wherein:
each reconfigurable inverter of the plurality of reconfigurable inverters is associated with a configuration cell;
the reconfigurable inverter is configured to act as an inverter in response to the configuration cell being set; and
the reconfigurable inverter is configured to act as a buffer in response to the configuration cell being reset.

11. A method for mapping a Boolean function of a plurality of inputs to a circuit including a plurality of programmable logic units (PLUs), each of the PLUs including a first reconfigurable hard logic (RHL), a second RHL, a third RHL, and a look-up table (LUT), the method comprising:
generating a first list of negating-permuting-negating functions (NPNs), corresponding to the first RHL;
generating a second list of NPNs, corresponding to the second RHL;
generating a third list of NPNs, corresponding to the third RHL;
matching the Boolean function to a first NPN;
mapping the Boolean function to the first RHL in response to the first NPN being included in the first list;
mapping the Boolean function to the second RHL in response to the first NPN not being included in the first list and being included in the second list;
mapping the Boolean function to the third RHL in response to the first NPN not being included in any of the first list and the second list and being included in the third list; and
mapping the Boolean function to the LUT in response to the first NPN not being included in any of the first list, the second list, and the third list, and the number of the plurality of inputs being smaller than four.

12. The method of claim 11, further comprising:
mapping the Boolean function to a first PLU and a second PLU of the plurality of PLUs in response to the Boolean function meeting a decomposition condition, the second PLU being coupled with the first PLU to receive the output of the first PLU; and
mapping the Boolean function to a third PLU, a fourth PLU, and a fifth PLU of the plurality of PLUs in response to the Boolean function not meeting the decomposition condition, the fifth PLU being coupled with the third PLU and the fourth PLU to receive the outputs of the third PLU and the fourth PLU.

13. The method of claim 12, wherein mapping the Boolean function to the first PLU and the second PLU includes:
decomposing the Boolean function into a series of two sub-functions, the two sub-functions including a first sub-function and a second-sub function, the first sub-function including a plurality of first sub-function inputs and a first sub-function output, and the second sub-function arranged to receive the first sub-function output;
matching the first sub-function to a second NPN;
matching the second sub-function to a third NPN; and
mapping the Boolean function to the first PLU and the second PLU in response to the Boolean function meeting the decomposition condition, the decomposition condition including a first sub-condition and one of a second sub-condition and a third sub-condition, the first sub-condition including the third NPN being included in one of the first list, the second list, and the third list, the second sub-condition including the second NPN being included in one of the first list, the second list, and the third list, and the third sub-condition including the number of the plurality of first sub-function inputs being smaller than four.

14. The method of claim 13, wherein mapping the Boolean function to the first PLU includes:
mapping the first sub-function to the first RHL in response to the second NPN being included in the first list;
mapping the first sub-function to the second RHL in response to the second NPN not being included in the first list and being included in the second list;
mapping the first sub-function to the third RHL in response to the second NPN not being included in any of the first list and the second list and being included in the third list; and
mapping the first sub-function to the LUT in response to the second NPN not being included in any of the first list, the second list, and the third list, and the number of the plurality of first sub-function inputs being smaller than four.

15. The method of claim 13, wherein mapping the Boolean function to the second PLU includes:
mapping the second sub-function to the first RHL in response to the third NPN being included in the first list;
mapping the second sub-function to the second RHL in response to the third NPN not being included in the first list and being included in the second list; and
mapping the second sub-function to the third RHL in response to the third NPN not being included in any of the first list and the second list, and being included in the third list.

16. The method of claim 12, wherein mapping the Boolean function to the third PLU, the fourth PLU, and the fifth PLU includes:
decomposing the Boolean function into a pair of cofactors including a first cofactor and a second cofactor;
mapping the first cofactor to the third PLU, including:
matching the first cofactor to a fourth NPN,
mapping the first cofactor to the first RHL in response to the fourth NPN being included in the first list,
mapping the first cofactor to the second RHL in response to the fourth NPN not being included in the first list and being included in the second list,
mapping the first cofactor to the third RHL in response to the fourth NPN not being included in any of the first list and the second list, and being included in the third list, and
mapping the first cofactor to the LUT in response to the fourth NPN not being included in any of the first list, the second list, and the third list;
mapping the second cofactor to the fourth PLU, including:
matching the second cofactor to a fifth NPN,
mapping the second cofactor to the first RHL in response to the fifth NPN being included in the first list,
mapping the second cofactor to the second RHL in response to the fifth NPN not being included in the first list and being included in the second list,
mapping the second cofactor to the third RHL in response to the fifth NPN not being included in any of the first list and the second list, and being included in the third list, and
mapping the second cofactor to the LUT in response to the fifth NPN not being included in any of the first list, the second list, and the third list; and
configuring the fifth PLU to act as a two-to-one multiplexer, arranged to receive one of the plurality of inputs as a selector input of the two-to-one multiplexer.

17. The method of claim 16, wherein configuring the fifth PLU includes configuring the first RHL to function as the two-to-one multiplexer.

18. The method of claim 11, wherein:

generating the first list includes generating a first list of Boolean functions, including:

$A \times B \times C \times D$, $A \times B \times (C+D)$, and $A \times B + C \times D$;

generating the second list includes generating a second list of Boolean functions, including:

$A \times (!B \times C + B \times D)$, $A \times (B + C \times D)$, $A \times (B + C + D)$, and $A \times (B \oplus C)$; and generating the third list includes generating a third list of Boolean functions, including:

$A \times B \times C \times D + !(A \times B) \times !C \times D$, $A \times B \times (C \oplus D)$, $A \times (B \oplus C + D)$, $A \times (B \times C + B \times D + C \times D)$, $!A \times !B \times !C + A \times B \times C$, $A \times B \times (C+D) + !A \times !B \times !C \times !D$, $A \times B \times C + !B \times !C$, $(A \oplus B) + C \times D$, $A \times (B \times !C \times D + !B \times C \times !D)$, $A \times B \times C \times D + !A \times !B \times !C \times !D$, $!A \times !B \times C \times D + (A \oplus B) \times !C \times !D$, and $A \times B \times C + !A \times !B \times !C + B \times C \times !D + !B \times !C \times D$, where A is a first input of the plurality of inputs, B is a second input of the plurality of inputs, C is a third input of the plurality of inputs, D is a fourth input of the plurality of inputs, ! is a logical negation operator, x is a logical AND operator, + is a logical inclusive OR operator, and $\oplus$ is a logical exclusive OR operator.

\* \* \* \* \*